(12) United States Patent
Huang et al.

(10) Patent No.: US 11,187,602 B2
(45) Date of Patent: Nov. 30, 2021

(54) DEVICE AND METHOD FOR PRESSURE FORCE INSPECTION

(71) Applicant: TAIWAN SEMICONDUCTOR MANUFACTURING CO., LTD., Hsinchu (TW)

(72) Inventors: Yung-Chang Huang, Taichung (TW); Tsun-En Kuo, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 281 days.

(21) Appl. No.: 16/399,430

(22) Filed: Apr. 30, 2019

(65) Prior Publication Data
US 2020/0018659 A1 Jan. 16, 2020

Related U.S. Application Data

(60) Provisional application No. 62/698,276, filed on Jul. 15, 2018.

(51) Int. Cl.
| | |
|---|---|
| *H01L 21/768* | (2006.01) |
| *G01L 5/00* | (2006.01) |
| *C25D 7/12* | (2006.01) |
| *G01L 5/22* | (2006.01) |
| *C25D 17/06* | (2006.01) |
| *H01L 21/68* | (2006.01) |
| *C25D 17/00* | (2006.01) |
| *H01L 21/683* | (2006.01) |

(52) U.S. Cl.
CPC ............ *G01L 5/009* (2013.01); *C25D 7/123* (2013.01); *C25D 17/001* (2013.01); *C25D 17/06* (2013.01); *G01L 5/226* (2013.01); *H01L 21/68* (2013.01); *H01L 21/6838* (2013.01); *H01L 21/76873* (2013.01)

(58) Field of Classification Search
CPC .............. H01L 21/68; H01L 21/76873; H01L 21/6838
See application file for complete search history.

(56) References Cited

U.S. PATENT DOCUMENTS

| | | | |
|---|---|---|---|
| 6,139,712 A | * | 10/2000 | Patton ...................... C25D 7/12 205/137 |
| 9,677,188 B2 | | 6/2017 | Stowell et al. |
| 10,692,754 B2 | * | 6/2020 | Huang .............. H01L 21/67253 |
| 2009/0093193 A1 | | 4/2009 | Bae |

FOREIGN PATENT DOCUMENTS

| | | |
|---|---|---|
| CN | 1908247 A | 2/2007 |
| CN | 101238552 A | 8/2008 |
| CN | 202395013 U | 8/2012 |
| CN | 102867771 A | 1/2013 |
| CN | 203792155 U | 8/2014 |
| CN | 104541367 A | 4/2015 |

* cited by examiner

*Primary Examiner* — Dale E Page
*Assistant Examiner* — Wilner Jean Baptiste
(74) *Attorney, Agent, or Firm* — Maschoff Brennan

(57) ABSTRACT

A method includes disposing a wafer in a cup of a clamshell of an electroplating apparatus. The wafer is clamped using the cup and a cone of the clamshell. A pressure force applied by the cone against the wafer is detected. Stopping clamping the wafer when the pressure force is higher than a predetermined value.

20 Claims, 26 Drawing Sheets

DEVICE AND METHOD FOR PRESSURE FORCE INSPECTION

PRIORITY CLAIM AND CROSS-REFERENCE

This application claims priority to U.S. Provisional Application Ser. No. 62/698,276, filed Jul. 15, 2018, which is herein incorporated by reference.

BACKGROUND

Electroplating is used in integrated circuit manufacturing processes to form electrically conductive structures. For example, in a copper damascene process, electroplating is used to form copper lines and vias within channels previously etched into a dielectric layer. In such a process, a seed layer of copper is first deposited into the channels and on the substrate surface via physical vapor deposition. Then, electroplating is used to deposit a copper layer over the seed layer such that the channels are filled. Excess copper is then removed by chemical mechanical polishing, thereby forming the individual copper features.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
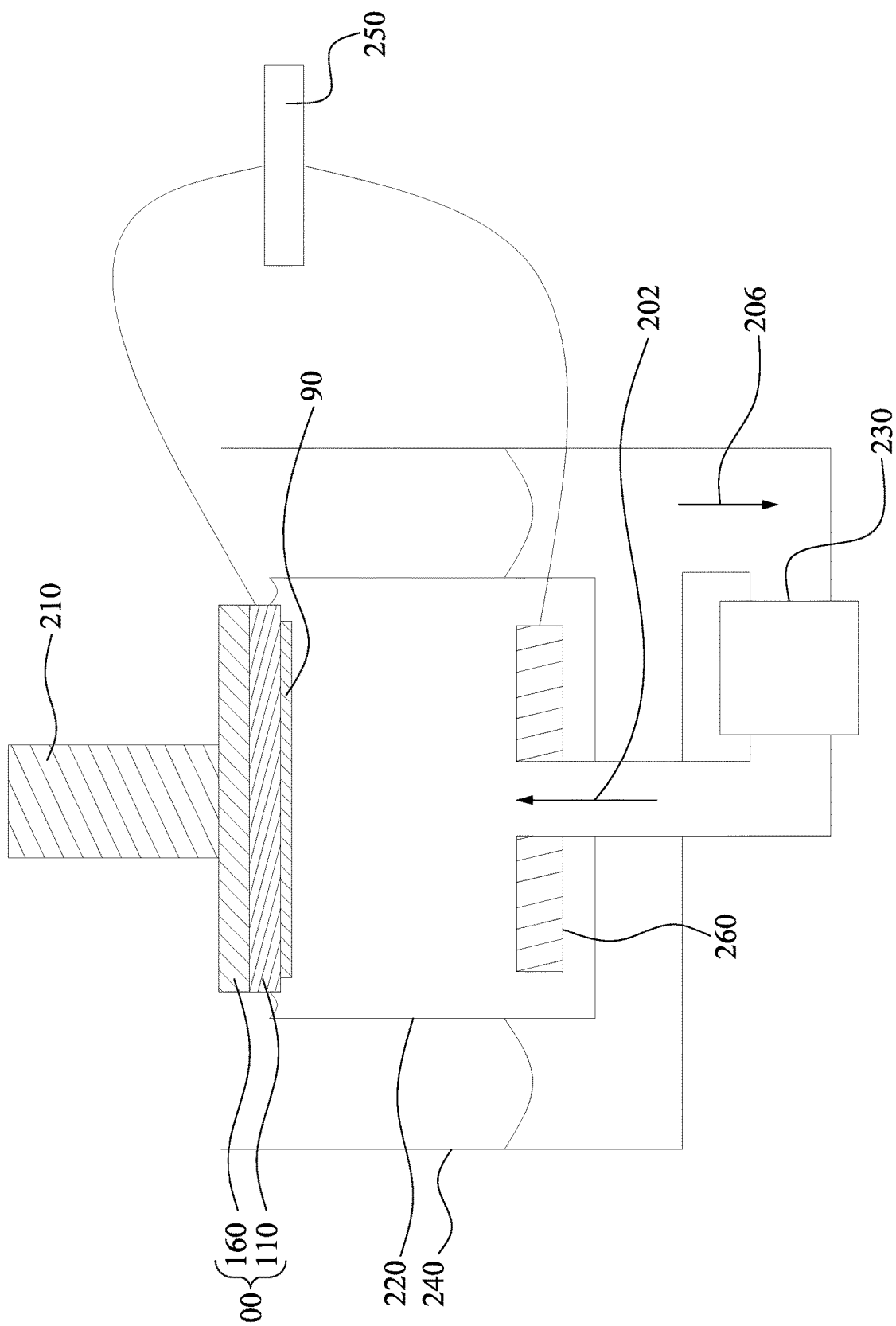
FIG. 1 is a diagrammatical view of an electroplating apparatus having a wafer mounted therein in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a diagrammatical view of an electroplating apparatus 10 having a wafer 90 mounted therein in accordance with some embodiments of the present disclosure. The electroplating apparatus 10 includes a clamshell 100 mounted on a rotatable spindle 210 which allows rotation of the clamshell 100. The clamshell 100 includes a cup 110 in which the wafer 90 is positioned during an electroplating process, and also a cone 160 that is lowered into the cup 110 to clamp the wafer 90 within the cup 110 during the electroplating process. Various cup and cone designs beyond those specifically depicted here can function in accordance with this disclosure. For example, the cup has an interior region in which the wafer 90 sits and the cone 160 presses the wafer 90 against a region of the cup 110 to hold it in place.

During the electroplating process cycle, the wafer 90 is mounted in the cup 110. The clamshell 100 and hence the wafer 90 are then placed in a plating bath 220 containing a plating solution. As indicated by the arrow 202, the plating solution is continually provided to the plating bath 220 by a pump 230. In some embodiments, the plating solution flows upwards to the center of the wafer 90 and then radially outward and across the wafer 90. By directing the plating solution towards the center of the wafer 90, any gas bubbles entrapped on the wafer 90 are quickly removed. Gas bubble removal is further enhanced by rotating the clamshell 100 and hence the wafer 90. The plating solution then overflows the plating bath 220 to an overflow reservoir 240 as indicated by arrows 204. The plating solution is then filtered (not shown) and returned to the pump 230 as indicated by the arrow 206 completing the recirculation of the plating solution.

A DC power supply 250 has a negative output lead electrically connected to the wafer 90 through one or more slip rings, brushes and contacts (not shown). The positive output lead of the power supply 250 is electrically connected to an anode 260 located in the plating bath 220. During use, the power supply 250 biases the wafer 90 to have a negative potential relative to the anode 260 causing an electrical current to flow from the anode 260 to the wafer 90. (As used herein, electrical current flows in the same direction as the net positive ion flux and opposite the net electron flux.) This causes an electrochemical reaction (e.g. $Cu^{++}+2e^-=Cu$) on the wafer 90 which results in the deposition of the electrically conductive layer (e.g. copper) on the wafer 90. The ion concentration of the plating solution is replenished during the plating cycle, for example by dissolving a metallic anode (e.g. $Cu=Cu^{++}+2e^-$).

The depicted clamshell 100 is a closed contact system in which the cone 160 moves towards the cup 110 to together clamp the wafer 90. However, upon clamping the cone 160 to the cup 110 and the wafer 90 before the electroplating process, the cone 160 may break the wafer 90 if the cone 160 presses the wafer 90 hardly or if the wafer 90 and/or the cone 160 is/are misaligned with the cup 110. The broken wafer 90 has to be abandon and wasted, and the efficiency of the electroplating process is lowered. As such, the clamshell 100 includes various features that help to inspect if the cone 160 presses the wafer 90 with a huge force or if the wafer 90 and/or the cone 160 is/are aligned with the cup 110 during or before the electroplating process.

Figure 2:
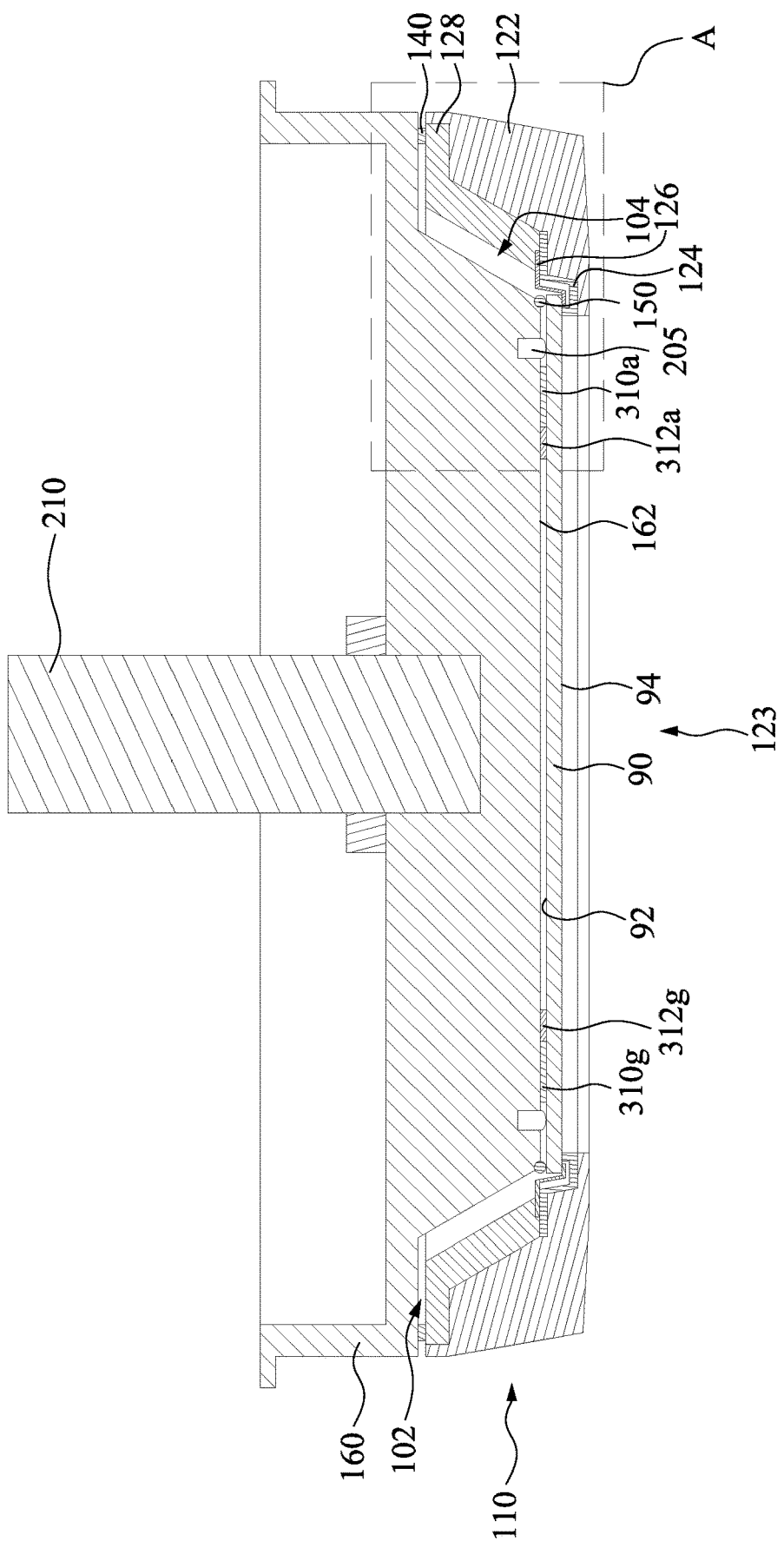
FIG. 2 is a cross-sectional view of the clamshell and the wafer of FIG. 1 in accordance with some embodiments of the present disclosure.
Figure 3:
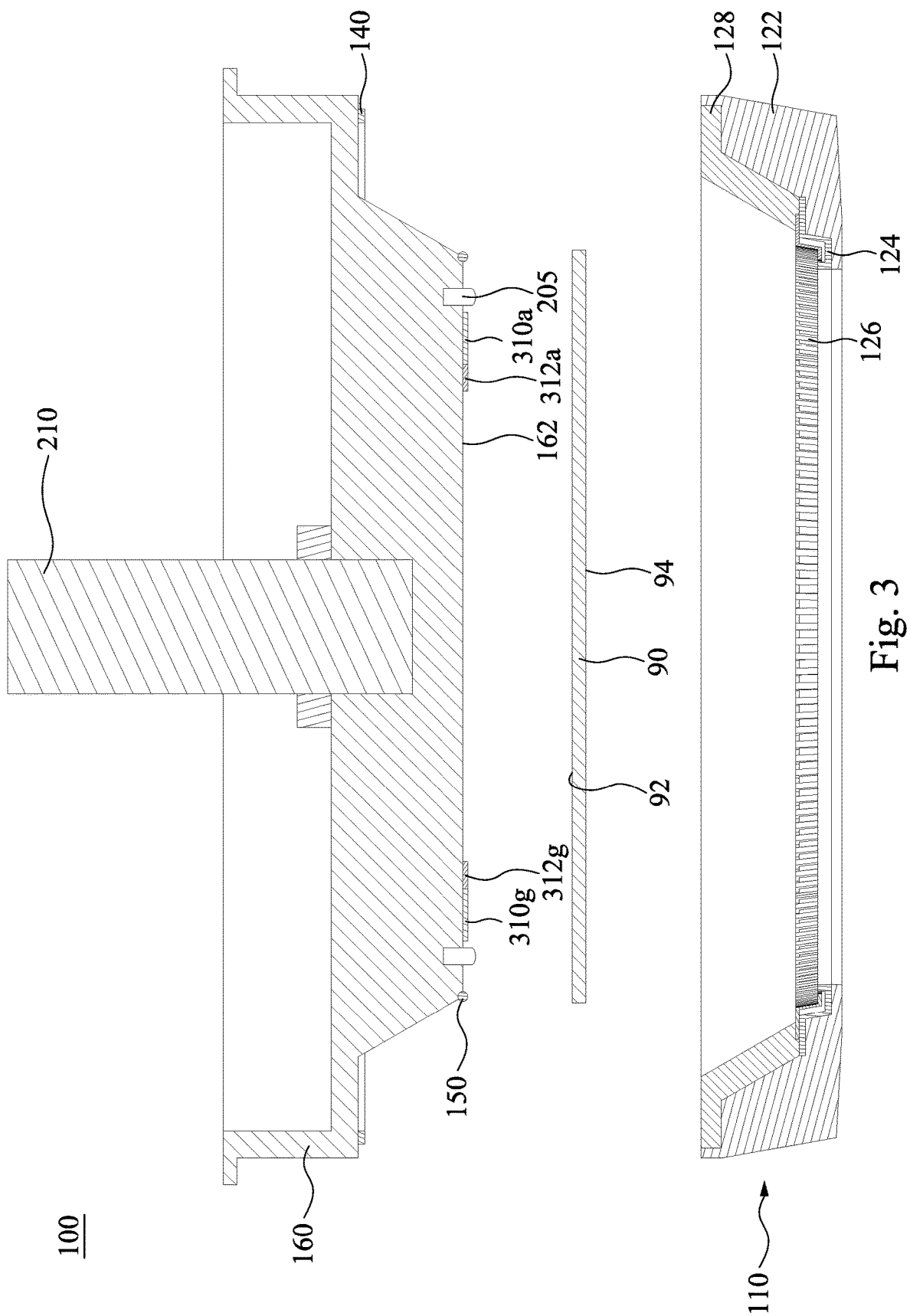
FIG. 3 is an exploded view of the clamshell and the wafer of FIG. 2.
Figure 4:
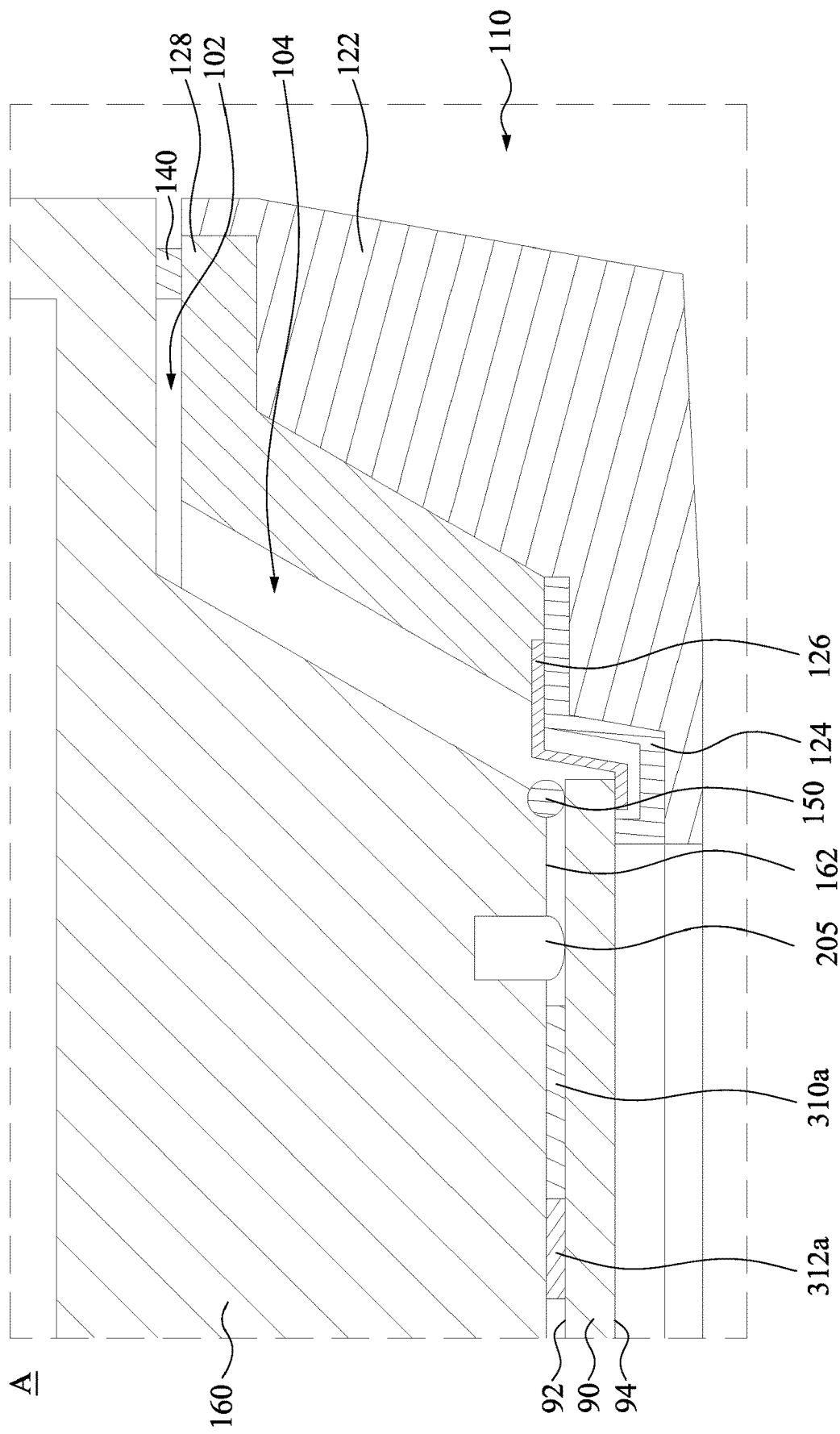
FIG. 4 is an enlarged cross-sectional view of a region of the clamshell in FIG. 2 in accordance with some embodiments of the present disclosure.

FIG. 2 is a cross-sectional view of the clamshell 100 and the wafer 90 of FIG. 1 in accordance with some embodiments of the present disclosure. FIG. 3 is an exploded view of the clamshell 100 and the wafer 90 of FIG. 2. FIG. 4 is an enlarged cross-sectional view of a region A of the clamshell 100 in FIG. 2 in accordance with some embodiments of the present disclosure. In FIGS. 2 and 4, the clamshell 100 is in the closed position, i.e. the cone 160 is in abutting contact with the cup 110 and is in pressing contact with the backside 92 of the wafer 90. The cone 160 and the cup 110 are clamped together by pulling a vacuum in a region 102 between the cone 160 and the cup 110. An O-ring 140 is in the region 102 and between the cone 160 and the cup 110. The region 102 is evacuated by a vacuum line (not shown) to clamp the cone 160 to the cup 110. The use of vacuum to clamp the cone 160 to the cup 110 ensures the two clamping surfaces remain flat and properly mated. In FIG. 3, the clamshell 100 is in the open position, i.e., the cone 160 is vertically separate from the cup 110.

Reference is made to FIG. 4. By clamping the cone 160 to the cup 110, a pressing surface 162 of the cone 160 presses against the backside 92 of the wafer 90. This forces the perimeter region of plating surface 94 of the wafer 90 against the cup 110. As a secondary measure to prevent contamination of the backside 92 of the wafer 90, an O-ring 150 is located in a channel of the pressing surface 162 of the cone 110. The O-ring 150 extends beyond the plane defined by the pressing surface 162 and is interposed between the cone 160 and the backside 92 of the wafer 90. A resulting region 104 is pressurized with a gas from a compressed gas line (not shown), may be dry air or an inert gas such as argon or nitrogen. More particularly, the region 104 (a cavity) is defined by the cone 160, the cup 110, the wafer 90, and the O-rings 140 and 150. The O-ring 150 prevents the pressurized gas in the region 104 from contacting most of the backside 92 of the wafer 90 and thus eliminates any possible damage to the wafer 90 from the pressurized gas. Further, by pressurizing the region 104, any inadvertent leak in the seal formed between the plating surface 94 of the wafer 90 and the cup 110 results in the escape of pressurized gas from the region 104 into the plating solution, i.e. prevents the plating solution from entering into the region 104 and contaminating the backside 92 of the wafer 90. The clamshell 100 further includes plungers 205 which extend from the cone 160 beyond the pressing surface 162 of the cone 160. The plungers 205 may be springs. When the clamshell 100 is in the closed position, the plungers 205 are also retracted into the cone 160 and press on the backside 92 of the wafer 90. After the electroplating processing, the clamshell 100 is raised from the plating solution and the procedure described above is reversed to unload the wafer 90. The plungers 205 prevent the wafer 90 from sticking to the cone 160 when the clamshell 100 is opened.

Figure 5:
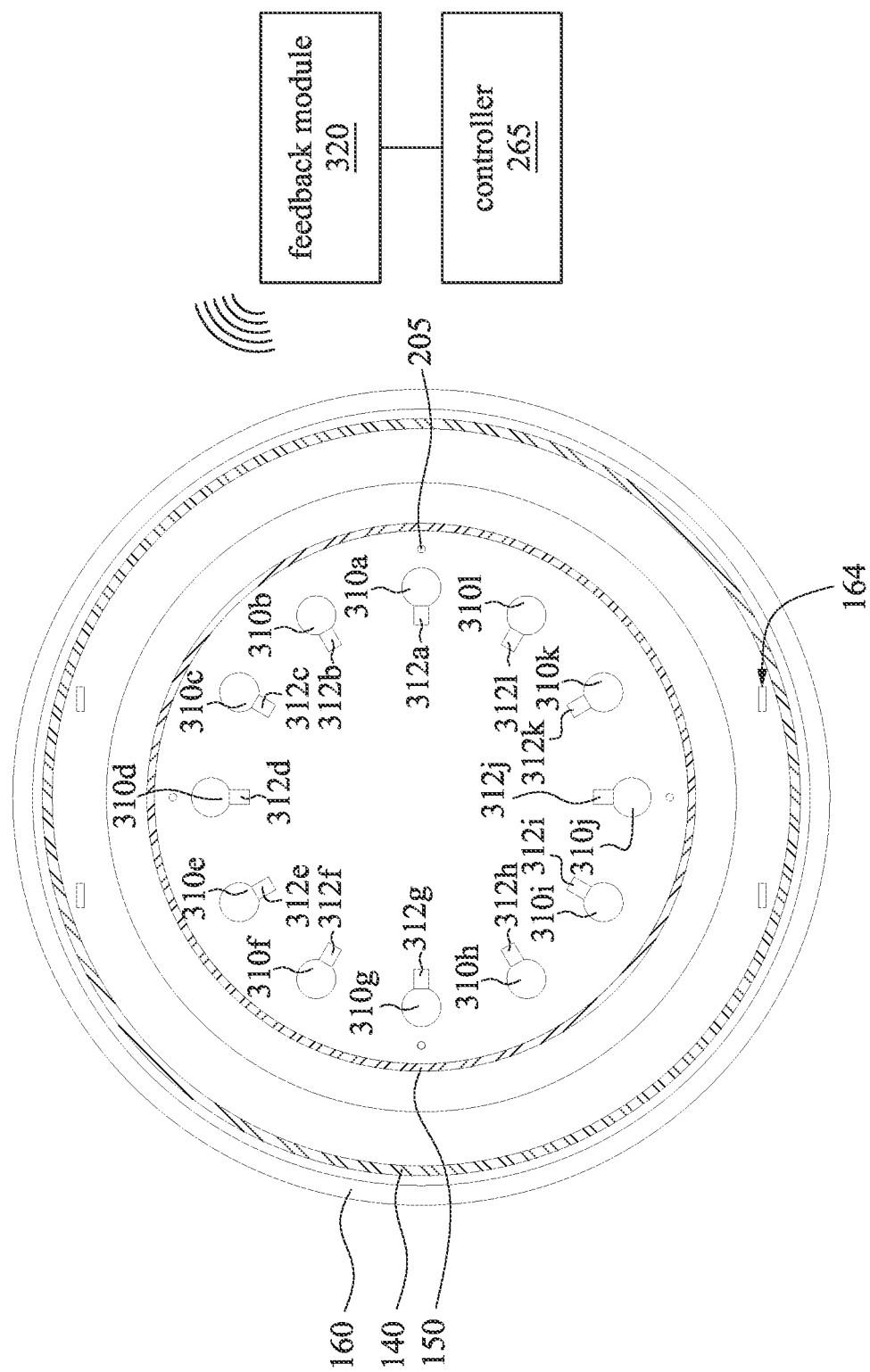
FIG. 5 is a bottom view of the cone in FIG. 3.

In some embodiments, if the cone 160 presses the wafer 90 too much, the wafer 90 may be broken. As such, an inspection feature can be added into the clamshell 100 to inspect the pressure force of the cone 160 in real time or in advance. Reference is made to FIGS. 4 and 5, where FIG. 5 is a bottom view of the cone 160 in FIG. 3. The clamshell 100 further includes a plurality of pressure sensors 310a-310l disposed on the pressing surface 162. The pressure sensor has a press detection function for measuring the pressure of external force applied to a surface (also referred to as a pressing force). In some embodiments, the pressure sensor can be a resistive pressure sensor. The resistive pressure sensor converts the mechanical pressure value into a proportional electrical signal. The pressure sensor may include a stable main body and a (thin) diaphragm. The diaphragm is equipped with strain-sensitive and compression-sensitive resistance structures, so-called strain gauges (DMS). The diaphragm is deflected under the influence of pressure. Thus, the strain gauges attached to it are elongated or compressed and its electrical resistance changes. This change in resistance is substantially proportional to the pressure. It is noted that other types of the pressure sensors can be applied to the clamshell 100.

In FIGS. 4 and 5, the pressure sensors 310a-310l are disposed between the cone 160 and the wafer 90. Further, the O-ring 150 surrounds the pressure sensors 310a-310l. The pressure sensors 310a-310l are arranged as a circle. The pressure sensor 310a is opposite to the pressure sensor 310g, the pressure sensor 310b is opposite to the pressure sensor 310h, the pressure sensor 310c is opposite to the pressure sensor 310i, the pressure sensor 310d is opposite to the pressure sensor 310*j*, the pressure sensor 310*e* is opposite to the pressure sensor 310*k*, and the pressure sensor 310*f* is opposite to the pressure sensor 310*l*. In some embodiments, the pressure sensors 310*a*-310*l* are substantially equidistant from each other. In some embodiments, the pressure sensors 310*a*-310*l* have the same or different sensing area(s). It is noted that the number of the pressure sensors shown in FIG. 5 is for illustrative purposes, and should not limit the present disclosure. Embodiments fall within the present disclosure if the number of the pressure sensors is greater than one.

When the cone 160 presses the wafer 90, the pressure sensors 310*a*-310*l* touches the wafer 90. The pressure sensors 310*a*-310*l* begin to detect pressure forces when the cone 160 continuously press the wafer 90. The detected pressure forces increase as the pressure force applied by the cone 160 increases. The wafer 90 can not bear the pressure force and begin to crash if the pressure forces are higher than a maximum predetermined value. Hence, the clamshell 100 may further include a feedback module 320 in electrically communication to the pressure sensors 310*a*-310*l* to receive the detected pressure forces of the pressure sensors 310*a*-310*l* and provide an alarm signal if at least one of the pressure sensors 310*a*-310*l* has a pressure force higher than the maximum predetermined value. In some embodiments, the feedback module 320 provides a sound signal, and an operator may manually stop the pressing operation of the cone 160 to prevent the wafer 90 from being broken. In some other embodiments, the feedback module 320 is further electrically connected to a controller 265 that controls the press operation of the cone 160. The feedback module 320 is configured to send a signal to the controller 265 to stop the motion of the cone 160 when at least one of the pressure sensors 310*a*-310*l* has a pressure force higher the maximum predetermined value.

Furthermore, the feedback module 320 and the pressure sensors 310*a*-310*l* can further inspect if the cone 160 and the cup 110 clamp the wafer 90 well (or with an enough force). If the cone 160 and the cup 110 do not clamp the wafer 90 well, the wafer 90 can not be in a fixed position and may shift during the electroplating process. In some embodiments, the feedback module 320 monitors the pressure forces of the pressure sensors 310*a*-310*l* to be higher than a minimum predetermined value. If the pressure forces are not higher than the minimum predetermined value, the feedback module 320 does not send a stop signal to the controller 265 to stop the motion of the cone 160.

In some embodiments, the maximum predetermined value may be in a range from about 240 g to about 1200 g, and the minimum predetermined value may be in a range from about 60 g to about 180 g, and the present disclosure is not limited in this respect.

Reference is made to FIG. 5. In some embodiments, the feedback module 320 and the pressure sensors 310*a*-310*l* are in electrically communication in a wireless manner. That is, the feedback module 320 remotely receives the data (i.e., the pressure forces) of each of the pressure sensors 310*a*-310*l*. Hence, the clamshell 100 further includes a plurality of transmitters 312*a*-312*l* respectively connected to the pressure sensors 310*a*-310*l*. The transmitters 312*a*-312*l* respectively receive the data of the pressure sensors 310*a*-310*l* and then send the data to the feedback module 320. In some embodiments, the transmitters 312*a*-312*l* are disposed on the pressing surface 162, between the cone 160 and the wafer 90, and respectively adjacent to the pressure sensors 310*a*-310*l*.

Figure 6:
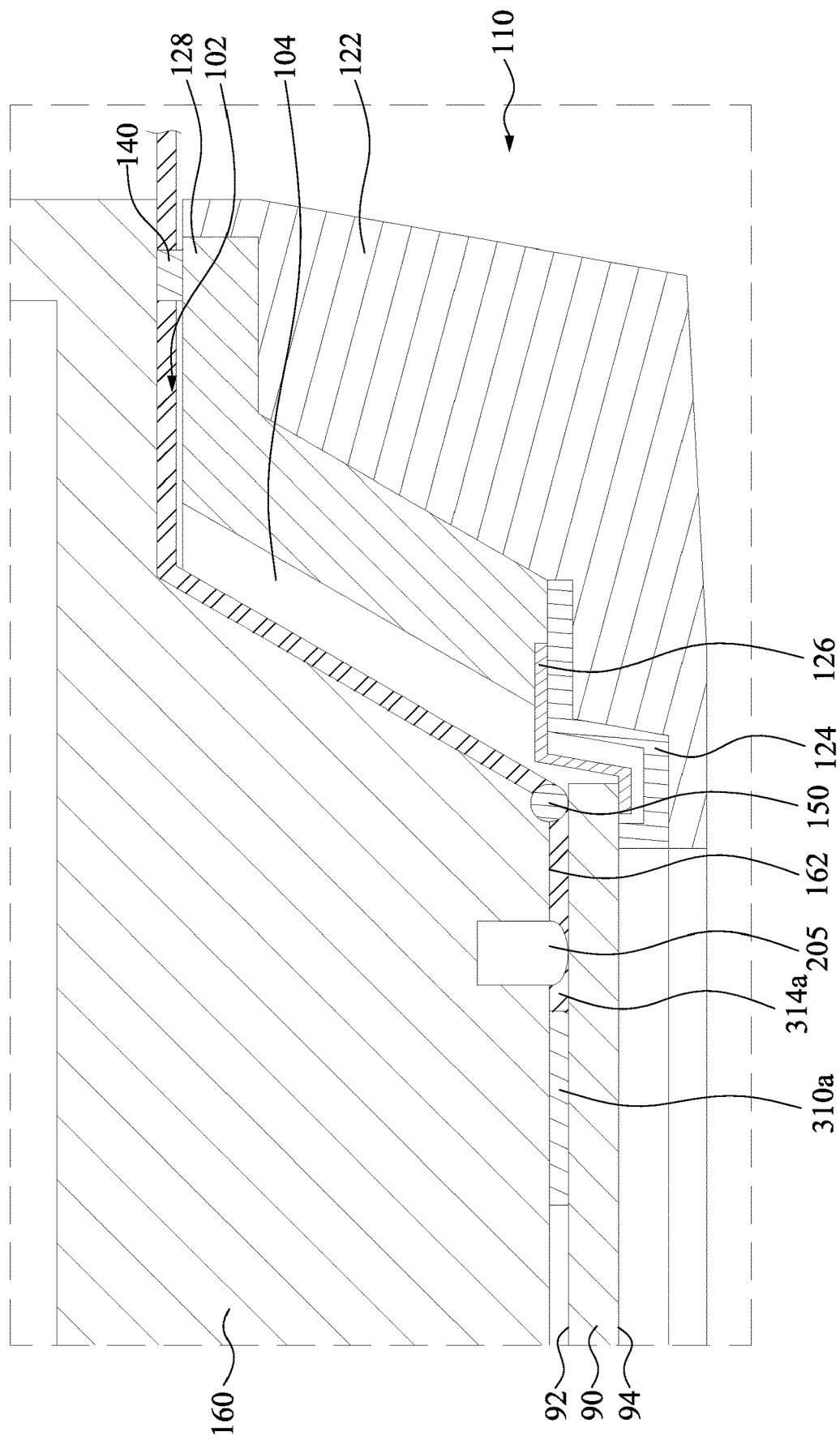
FIG. 6 is an enlarged cross-sectional view of the region of the clamshell of FIG. 2 in accordance with some other embodiments of the present disclosure.
Figure 7:
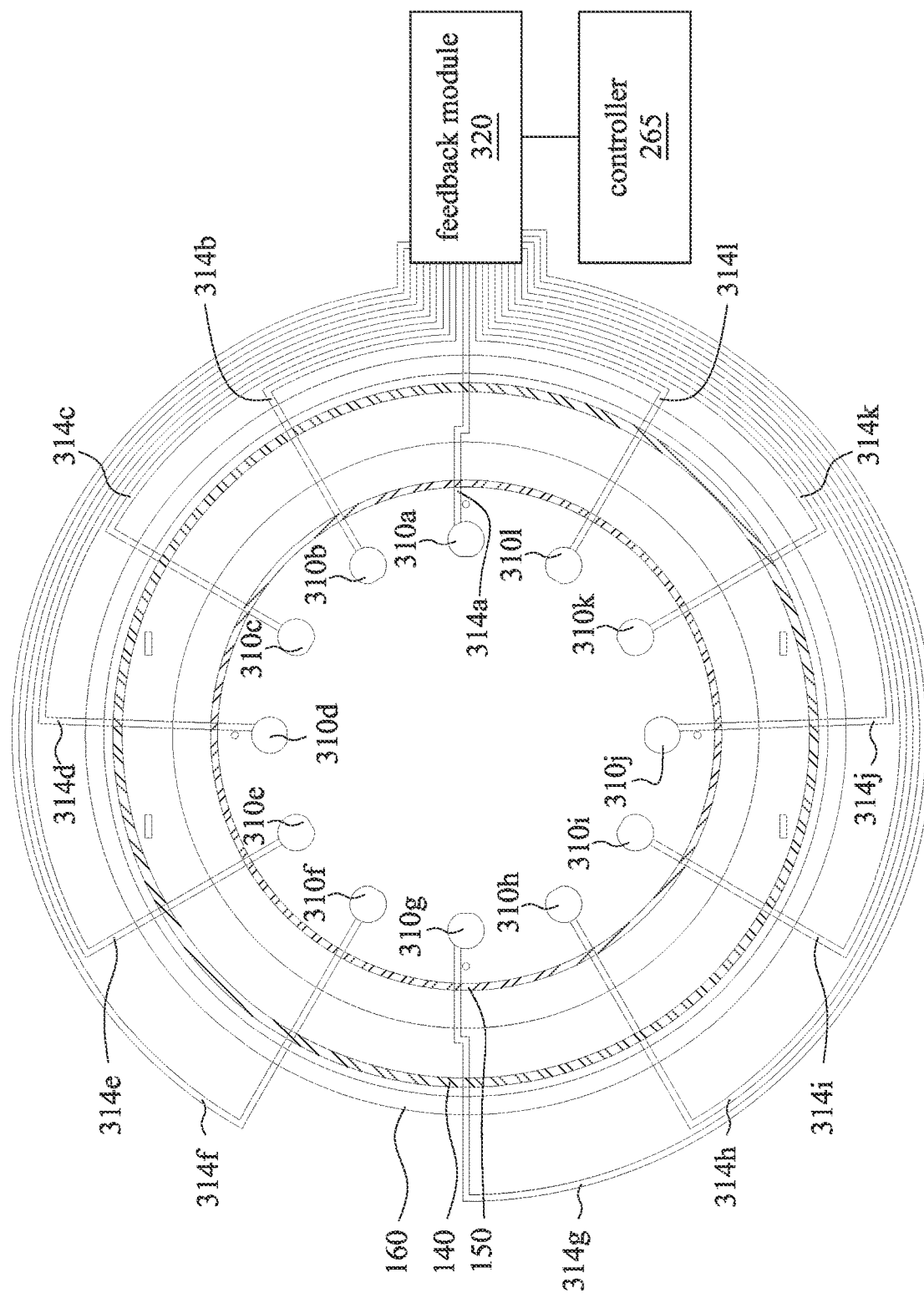
FIG. 7 is a bottom view of the cone in FIG. 6.

FIG. 6 is an enlarged cross-sectional view of the clamshell 100 of FIG. 2 in accordance with some other embodiments of the present disclosure, and FIG. 7 is a bottom view of the cone 160 in FIG. 6. In some other embodiments, the feedback module 320 and the pressure sensors 310*a*-310*l* are electrically connected by using wires 314*a*-314*l*. The wires 314*a*-314*l* respectively interconnect the pressure sensors 310*a*-310*l* and the feedback module 320. Hence, the data of each of the pressure sensors 310*a*-310*l* can be sent to the feedback module 320 through the wires 314*a*-314*l*. In some embodiments, the wires 314*a*-314*l* passes though the o-rings 150 and 140 as shown in FIG. 6. In some embodiments, one or some of the pressure sensors 310*a*-310*l* can be electrically connected to the feedback module 320 in a wireless manner, and the rest of the pressure sensors 310*a*-310*l* are electrically connected to the feedback module 320 by using wires.

Reference is made to FIG. 3. The wafer 90 remains flat when it is disposed in the cup 110. In some embodiments, however, the wafer 90 may be in the wrong position within the cup 110, such that the wafer 90 may be non-flat. The non-flat wafer 90 may be broken when the cone 160 lower its position to clamp the wafer 90. The broken wafer 90 has to be abandon and wasted, and the efficiency of the electroplating process is lowered. As such, the pressure sensors 310*a*-310*l* and the feedback module 320 can further inspect the flatness of the wafer 90 in real time.

Figure 8:
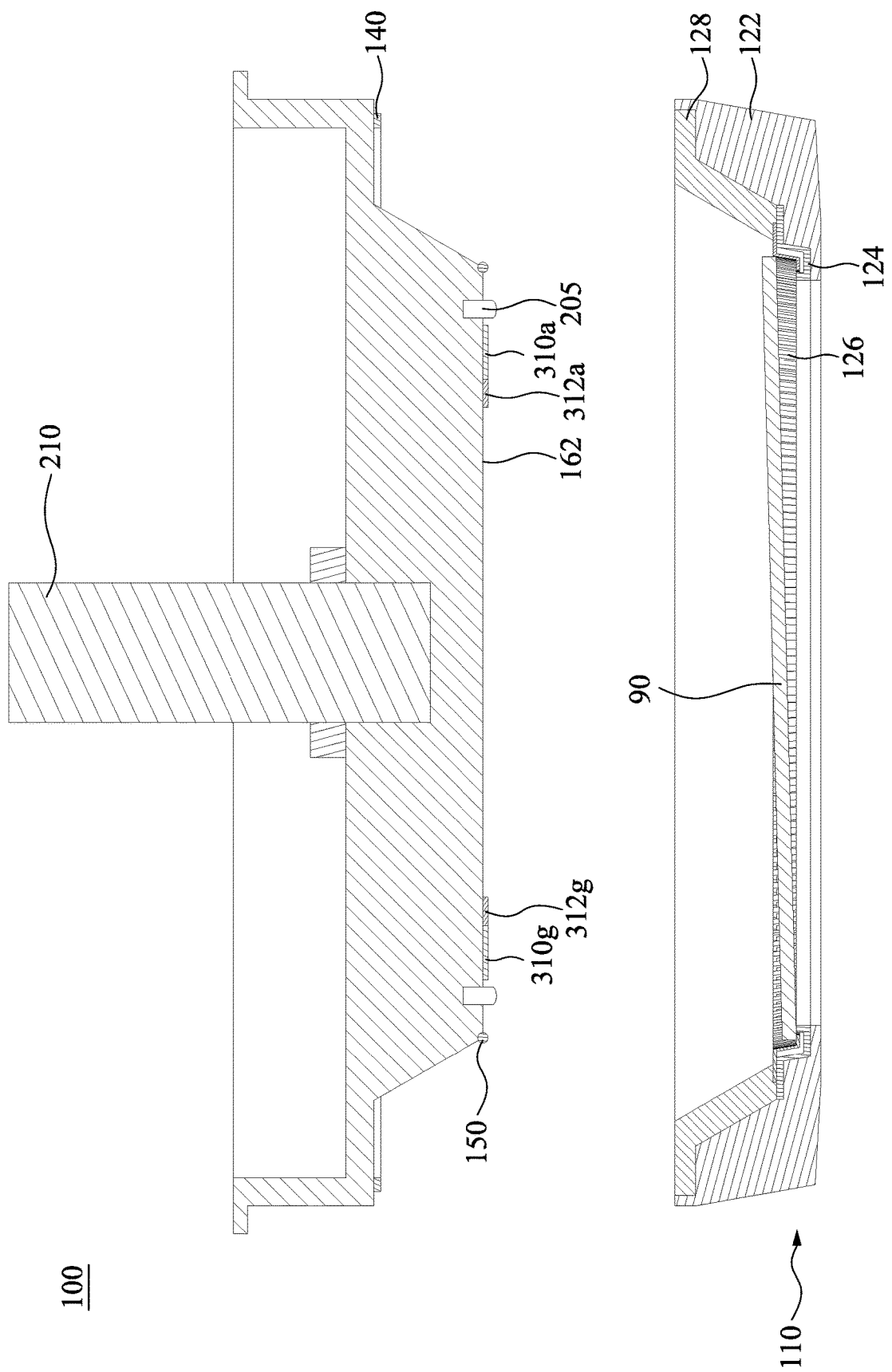
FIG. 8 is an exploded view of the clamshell and the wafer of FIG. 2 in some other embodiments.

Reference is made to FIGS. 5 and 8, where FIG. 8 is an exploded view of the clamshell 100 and the wafer 90 of FIG. 2 in some other embodiments. The wafer 90 in FIG. 8 is not flat (is inclined) relative to the cup 110 and the cone 160, such that the wafer 90 is referred to as in the wrong position. In FIG. 8, the wafer 90 is inclined. When the cone 160 presses against the backside 92 of the wafer 90, the pressure sensor 310*a* first touches the wafer 90. The pressure sensors 310*b* and 310*l*, 310*c* and 310*k*, . . . , and finally the pressure sensor 310*g* sequentially touch the wafer 90 if the cone 160 continuously presses the wafer 90. Hence, the pressure sensors 310*a*-310*l* sense different pressure forces. The pressure sensors at opposite positions (e.g., the pressure sensors 310*a* and 310*g* in FIG. 5) will sense a huge different pressure forces if the wafer 90 is inclined at a large angle. In this situation, the wafer 90 will be broken when the cone 160 clamps the wafer 90 too much. Therefore, the feedback module 320 can further inspect the difference between the maximum and minimum pressure forces of the pressure sensors 310*a*-310*l*. The feedback module 320 will send a stop signal to the controller 265 if the difference value between the maximum and minimum pressure forces (e.g., the pressure forces of the pressure sensors 310*a* and 310*g* in this case) is higher than a predetermined difference value. In some embodiments, the predetermined difference value is in a range of about 0 g to about 800 g.

Figure 9:
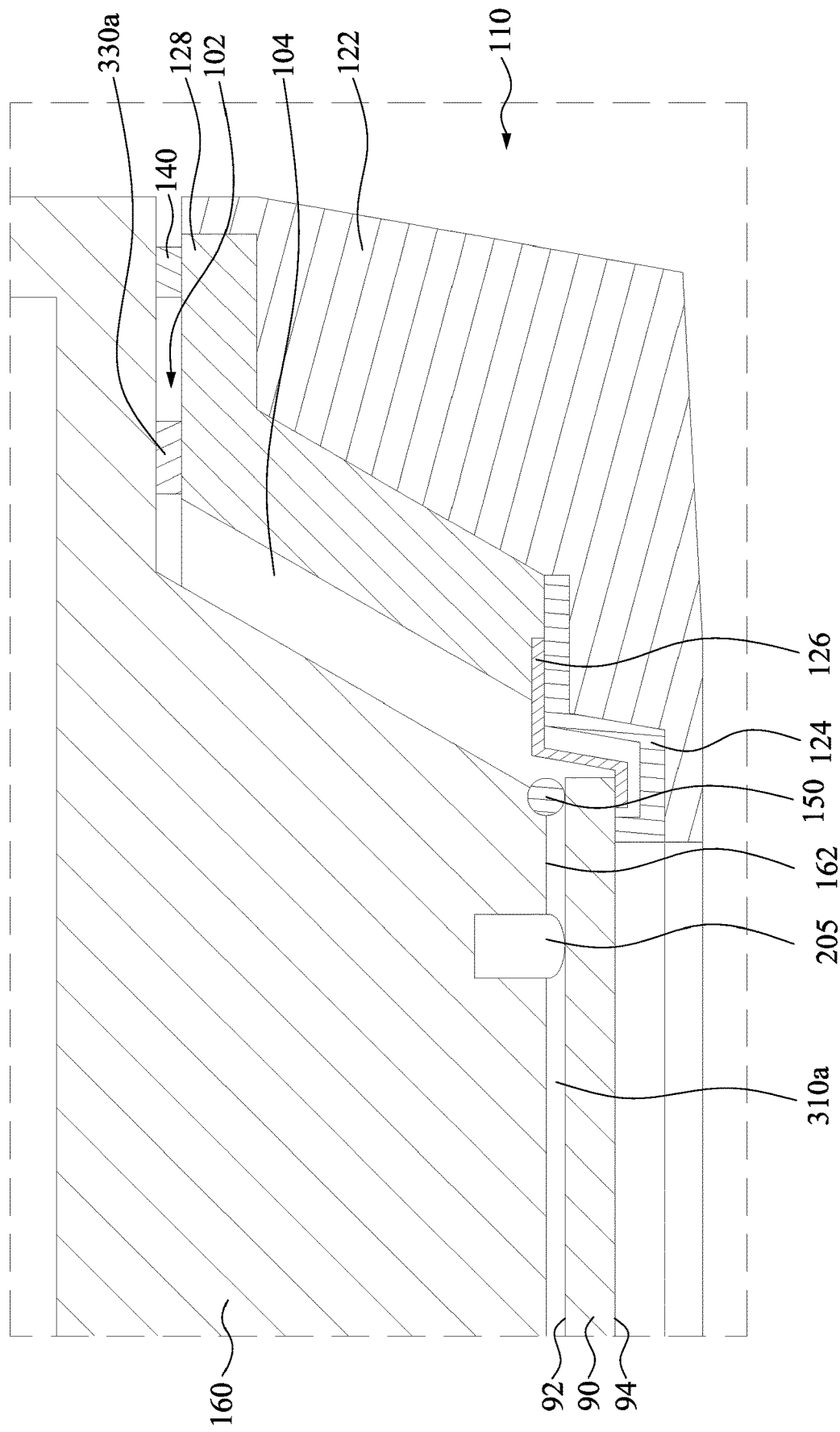
FIG. 9 is an enlarged cross-sectional view of the region of the clamshell of FIG. 2 in accordance with some other embodiments of the present disclosure.
Figure 10:
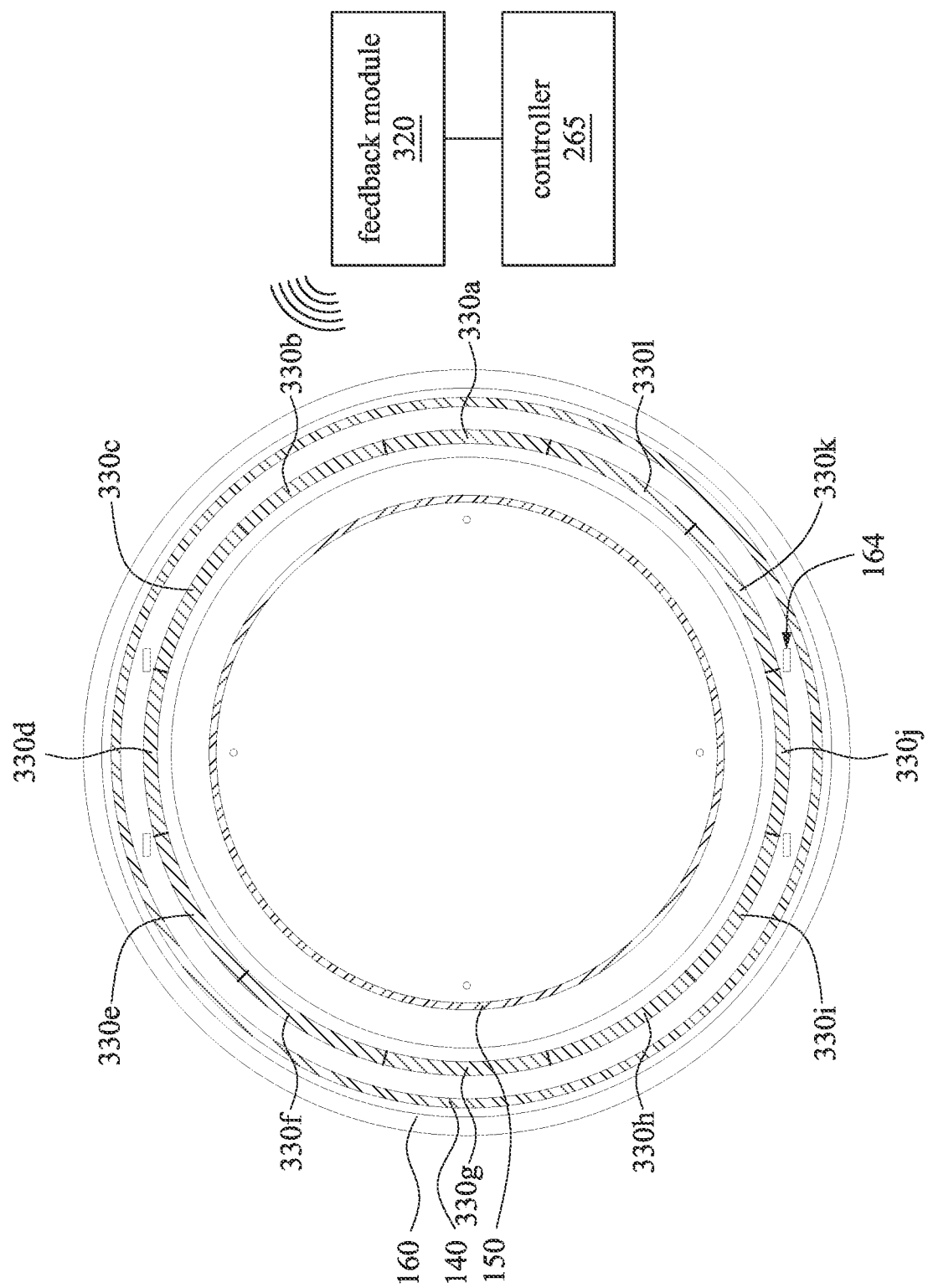
FIG. 10 is a bottom view of the cone in FIG. 9.

FIG. 9 is an enlarged cross-sectional view of the clamshell 100 of FIG. 2 in accordance with some other embodiments of the present disclosure, and FIG. 10 is a bottom view of the cone 160 in FIG. 9. In some embodiments, the clamshell 100 further includes a plurality of pressure sensors 330*a*-330*l* disposed on the region 102. That is, the pressure sensors 330*a*-330*l* are disposed between the O-rings 140 and 150 and between the cone 160 and the cup 110. Further, the O-ring 140 surrounds the pressure sensors 330*a*-330*l*, and the pressure sensors 330*a*-330*l* surrounds the O-ring 150. In some embodiments, the pressure sensors 330*a*-330*l* are in contact with the cone 160 when the clamshell 100 is open (as shown in FIG. 10). In some other embodiments, the pressure sensors 330*a*-330*l* are in contact with the cup 110 when the clamshell 100 is open. The pressure sensors 330*a*-330*l* are arranged as a circle. The pressure sensor 330*a* is opposite to the pressure sensor 330*g*, the pressure sensor 330*b* is opposite to the pressure sensor 330h, the pressure sensor 330c is opposite to the pressure sensor 330i, the pressure sensor 330d is opposite to the pressure sensor 330j, the pressure sensor 330e is opposite to the pressure sensor 330k, and the pressure sensor 330f is opposite to the pressure sensor 330l. In some embodiments, the pressure sensors 330a-330l are in abutting contact with each other as shown in FIG. 10. In some other embodiments, the pressure sensors 330a-330l are substantially equidistant from each other. It is noted that the number of the pressure sensors shown in FIG. 10 is for illustrative purposes, and should not limit the present disclosure. Embodiments fall within the present disclosure if the number of the pressure sensors is greater than one.

When the cone 160 presses the wafer 90, the pressure sensors 330a-330l touches the cup 110. The pressure sensors 330a-330l begin to detect pressure forces when the cone 160 continuously press the wafer 90. The detected pressure forces increase as the pressure force applied by the cone 160 increases. The wafer 90 can not bear the pressure force and begin to crash if the pressure forces are higher a maximum predetermined value. Hence, the feedback module 320 can be in electrically communication to the pressure sensors 330a-330l to receive the detected pressure forces of the pressure sensors 330a-330l and provide an alarm signal if at least one of the pressure sensors 330a-330l has a pressure force higher a maximum predetermined value. In some embodiments, transmitters can be respectively connected to the pressure sensors 330a-330l to transmit the data to the feedback module 320. In some other embodiments, wires can be added to interconnect the pressure sensors 330a-330l and the feedback module 320. Furthermore, the feedback module 320 and the pressure sensors 330a-330l can further inspect if the cone 160 and the cup 110 clamp the wafer 90 well. If the pressure forces of the pressure sensors 330a-330l are not higher than a minimum predetermined value, the feedback module 320 does not send a stop signal to the controller 265 to stop the motion of the cone 160. In some embodiments, the maximum predetermined value may be in a range from about 240 g to about 1200 g, and the minimum predetermined value may be in a range from about 60 g to about 180 g, and the present disclosure is not limited in this respect.

In some other embodiments, the pressure sensors 330a-330l can be configured to inspect if the cone 160 is inclined relative to the cup 110. For example, the feedback module 320 will send a stop signal to the controller 265 if the difference value between the maximum and minimum pressure forces of the pressure sensors 330a-330l is higher than a predetermined difference value. In some embodiments, the predetermined difference value is in a range of about 0 g to about 800 g. The relative position of the cone 160 and the cup 110 can be adjusted (or calibrated) if the difference value is higher than a predetermined difference value. Other relevant structural and functional details of the pressure sensors 330a-330l are similar to the pressure sensors 310a-310l, and, therefore, a description in this regard will not be repeated hereinafter. In some embodiments, the clamshell 100 includes the pressure sensors 310a-310l and/or the pressure sensors 330a-330l, and the present disclosure is not limited in this respect.

Figure 11:
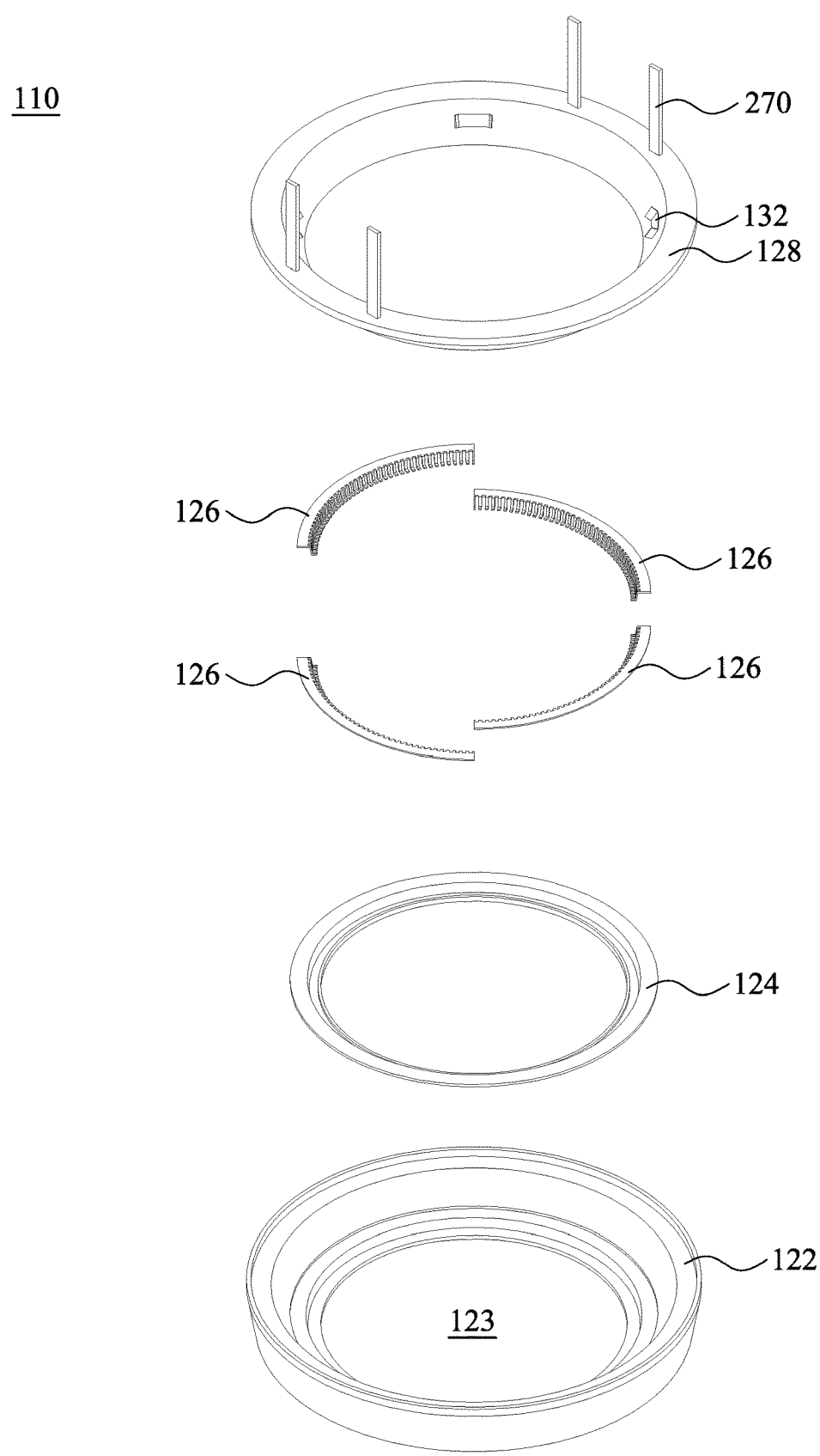
FIG. 11 is an exploded view of the cup in FIG. 2.

FIG. 11 is an exploded view of the cup 110 in FIG. 2. Reference is made to FIGS. 3, 4, and 11. The cup 110 includes a cup bottom 122 that defines an opening 123 to allow exposure of the wafer 90 positioned in the cup 110 to the electroplating solution. A seal 124 is positioned on the cup bottom 122 around the opening 203, and is configured to form a seal against the wafer 90 to prevent plating solution from reaching the contacts located behind the seal 124.

The cup bottom 122 may be made from any suitable material. Suitable materials include materials capable of demonstrating high strength and stiffness at the thicknesses used for the cup bottom 122, and also that resist corrosion by low pH plating solutions, such as copper/sulfuric acid solutions. One specific non-limiting example of a suitable material is titanium.

The seal 124 also may be formed from any suitable material. Suitable materials include materials that do not react with or are not corroded by the acidic solutions used for plating, and of a sufficiently high purity not to introduce contaminants into the plating solution. Examples of suitable materials include, but are not limited to, perfluoro polymers. In some embodiments, the seal 124 may be coated with a hydrophobic coating. This may allow the seal 124 to shed aqueous plating solution when removed from a plating bath, and also may facilitate the removal of water from the seal 124 during a spin-rinse process.

The cup 110 further includes an electrical contact structure 126 configured to form an electrically conductive connection between an external power supply and the wafer 90 positioned in the cup 110. The position of the electrical contact structure 126 is indicated in FIG. 4, and a general view of the part is shown in FIG. 11. As shown in these figures, the seal 124 is positioned between the electrical contact structure 126 and the cup bottom 122, and thereby insulates the cup bottom 122 from the electrical contact structure 126. In some embodiments, the cup 122 includes a plurality of electrical contact structure 126. Each electrical contact structure 126 is integral to a contact strip (e.g. see FIG. 12 described below) which is electrically isolated from the other electrical contact structures 126.

The electrical contact structure 126 is electrically connected to a conductive ring 128 that rests on an outer portion of the electrical contact structure 126. The conductive ring 128 may also be referred to herein as a "bus bar". The depicted conductive ring 128 is configured as a continuous, thick ring of metal having an interior side that tapers inwardly, i.e. toward a center of the ring, in an axial direction from the top of the ring toward the bottom of the ring.

Figure 12:
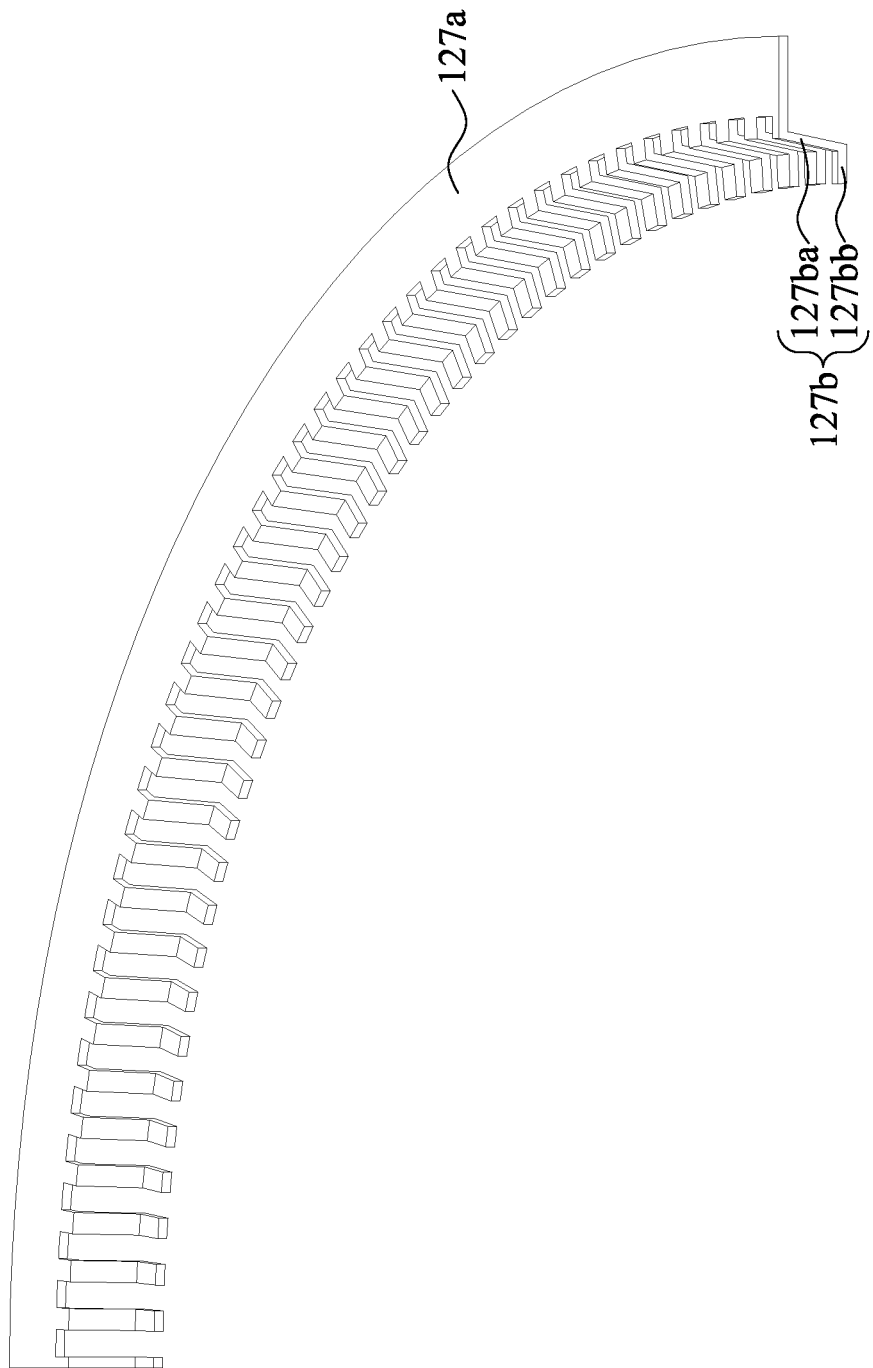
FIG. 12 is a local view of the electrical contact structure in FIG. 11.

FIG. 12 is a local view of the electrical contact structure 126 in FIG. 11. The electrical contact structure 126 includes a continuous outer ring 127a that is positioned beneath and in contact with the conductive ring 128 to allow uniform distribution of current from the conductive ring 128 to the electrical contact structure 126. The electrical contact structure 126 also includes a plurality of contacts 127b that extend from the outer ring 127a toward a center of the electrical contact structure 126. Each contact 127b includes a portion 127ba that extends downwardly and inwardly from the outer ring 127a. Further, the downwardly and inwardly extending portion 127ba of each contact 127b is spaced from the seal 124. Each contact 127b also includes an upwardly turned end portion 127bb configured to contact the wafer 90 positioned in the cup 110. In this manner, each contact 126 acts as a leaf spring that is pushed against the plating surface 94 of the wafer 90 in the cup 110 with some spring force to ensure good contact between the contact 127b and the wafer 90.

Reference is made to FIG. 11. The cup 110 further includes a wafer centering mechanism configured to hold the wafer 90 in a correct location within the cup 110. The depicted wafer centering mechanism includes a plurality of leaf springs 132 positioned around an inside of the conductive ring 128. Each leaf spring 132 includes a pair of downwardly-extending ends that contact an edge of the wafer 90 positioned in the cup 110. The spring forces exerted by each leaf spring 132 balance to hold the wafer 90 in a correct position relative to the seal 124, the electrical contact structure 126, etc.

Figure 13:
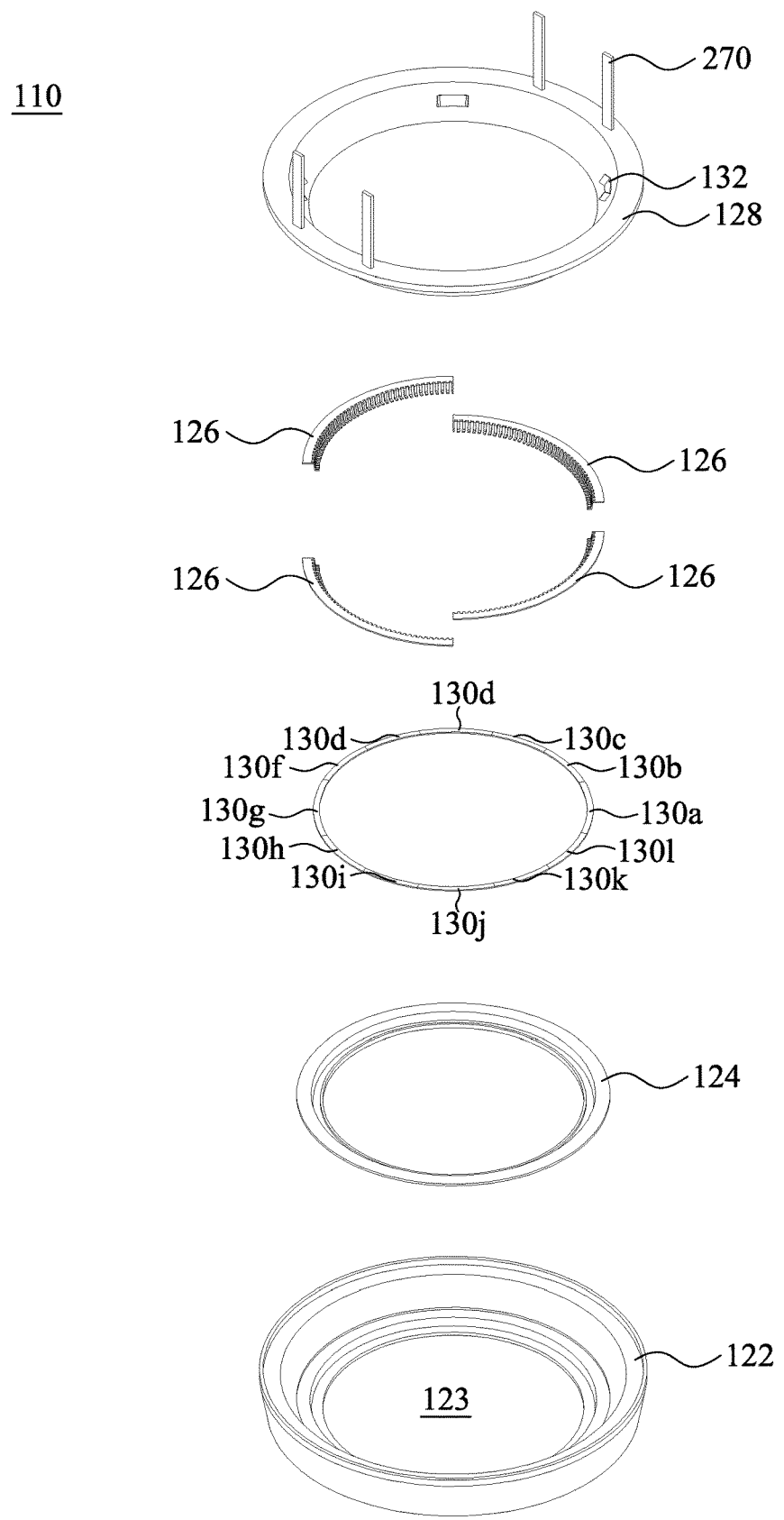
FIG. 13 is an exploded view of the cup in FIG. 2 according to some other embodiments.
Figure 14:
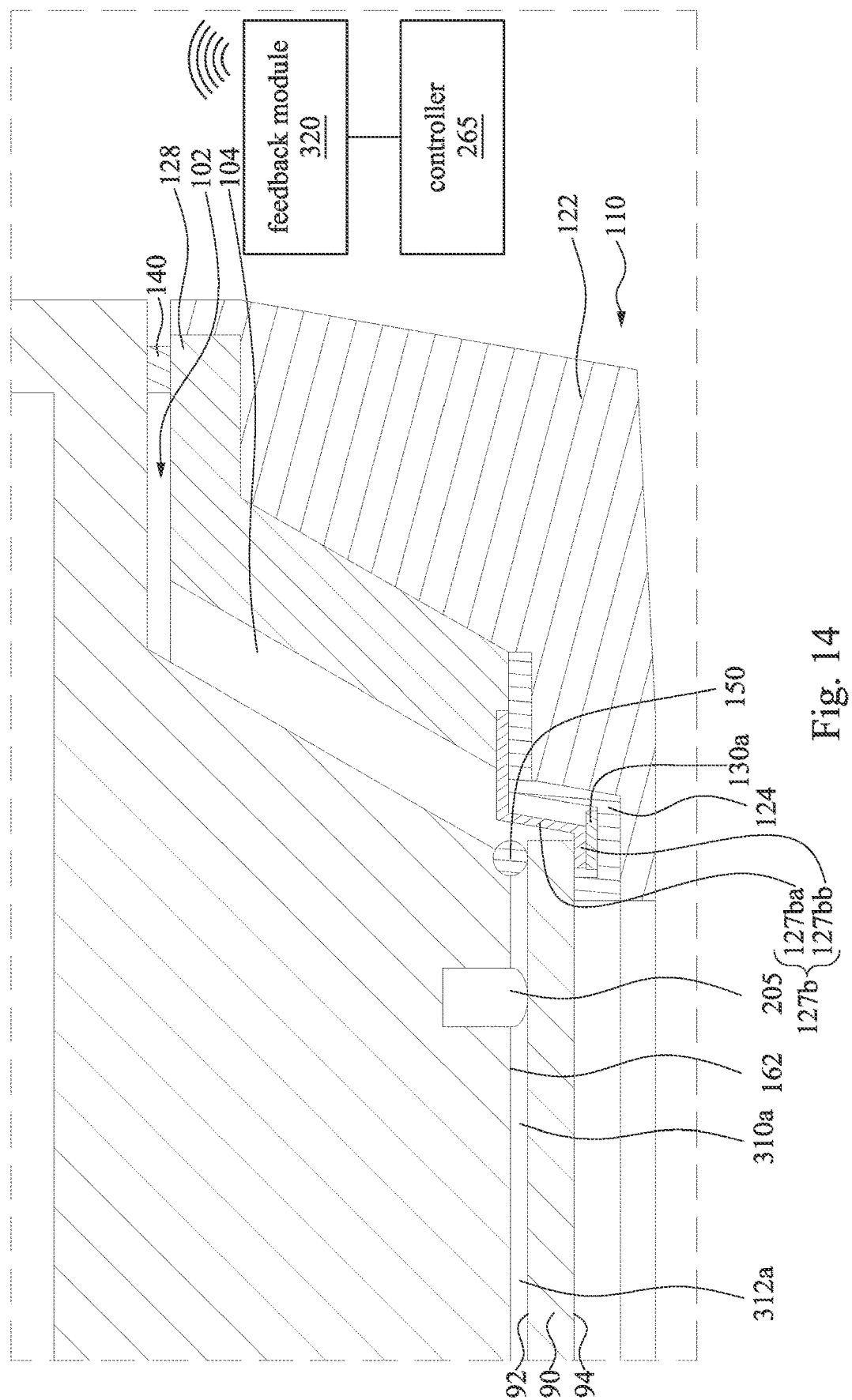
FIG. 14 is an enlarged cross-sectional view of the region of the clamshell in FIG. 2 in accordance with some other embodiments.

FIG. 13 is an exploded view of the cup 110 in FIG. 2 according to some other embodiments, and FIG. 14 is an enlarged cross-sectional view of the clamshell 100 in FIG. 2 in accordance with some other embodiments. In some embodiments, the wafer 90 may be non-flat if the wafer centering mechanism does not function well. As such, the inspection feature mentioned above can be added into the cup 110 to inspect the pressure force of the wafer 90 in real time. Furthermore, the cup 110 can include a plurality of pressure sensors 130a-130l disposed between the contacts 127b and the seal 124. Specifically, the pressure sensors 130a-130l are disposed between the portions 127bb of the contacts 127b and the seal 124. The pressure sensors 130a-130l are arranged as a circle. The pressure sensor 130a is opposite to the pressure sensor 130g, the pressure sensor 130b is opposite to the pressure sensor 130h, the pressure sensor 130c is opposite to the pressure sensor 130i, the pressure sensor 130d is opposite to the pressure sensor 130j, the pressure sensor 130e is opposite to the pressure sensor 130k, and the pressure sensor 130f is opposite to the pressure sensor 130l. In some embodiments, the pressure sensors 130a-130l are in abutting contact with each other as shown in FIG. 13. In some other embodiments, the pressure sensors 130a-130l are substantially equidistant from each other. It is noted that the number of the pressure sensors shown in FIG. 13 is for illustrative purposes, and should not limit the present disclosure. Embodiments fall within the present disclosure if the number of the pressure sensors is greater than one.

When the cone 160 presses the wafer 90, the wafer 90 touches the contacts 127b, and the contacts 127b move downwardly to touch the pressure sensors 130a-130l. The pressure sensors 130a-130l begin to detect pressure forces when the cone 160 continuously press the wafer 90. The detected pressure forces increase as the pressure force applied by the cone 160 increases. The pressure sensors 130a-130l are electrically connected to the feedback module 320, and the feedback module 320 receive the detected pressure forces of the pressure sensors 130a-130l. As mentioned above, the feedback module 320 may provide an alarm signal if at least one of the pressure sensors 130a-130l has a pressure force higher a maximum predetermined value or if the difference between the maximum and minimum pressure forces of the pressure sensors 130a-130l is higher than a predetermined difference value, and also monitors the pressure forces of the pressure sensors 310a-310l to be higher than a minimum predetermined value. Furthermore, the pressure sensors 130a-130l can be in electrically communication to the feedback module 320 in a wireless manner or by using wires as mentioned above.

Figure 15:
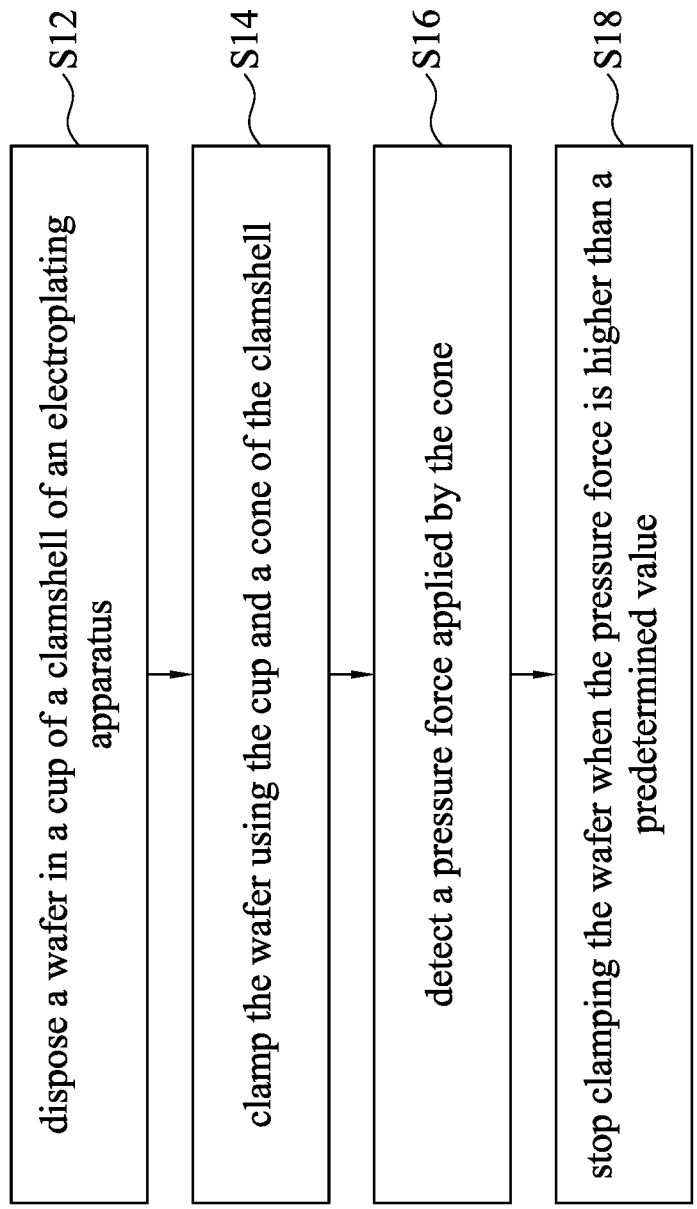
FIG. 15 is a flow chart of a method for inspecting the pressure force of the wafer according to some embodiments.

FIG. 15 is a flow chart of a method M10 for inspecting the pressure force of the wafer according to some embodiments. The method M10 is merely an example, and is not intended to limit the present disclosure beyond what is explicitly recited in the claims. Additional operations can be provided before, during, and after the method M10, and some operations described can be replaced, eliminated, or moved around for additional embodiments of the process. For clarity and ease of explanation, some elements of the figures have been simplified.

Method M10 includes operation S12: disposing a wafer in a cup of a clamshell of an electroplating apparatus. The wafer 90 is disposed in the cup 110 with its plating surface 94 facing downwardly as shown in FIG. 2. The contacts 127b (see FIG. 12) of the cup 110 is in contact with the plating surface 94 when the wafer 90 is disposed in the cup 110. In some embodiments, the wafer 90 may be inclined if the wafer centering mechanism (see FIG. 11) of the cup 110 does not function well, e.g., the wafer centering mechanism may be twisted and make the wafer 90 in the wrong position.

The method M10 of FIG. 15 further includes operation S14: clamping the wafer using the cup and a cone of the clamshell. In some embodiments, as shown in FIG. 2, the cone 160 presses the wafer 90 downwardly, such that the cone 160 and the cup 110 together clamp the wafer 90.

The method M10 of FIG. 15 further includes operation S16: detecting a pressure force applied by the cone. In some embodiments, the method M10 detects the pressure force(s) applied by the cone against the wafer, and the pressure force of the cone is detected by the pressure sensors 310a-310l in FIG. 5 and/or the pressure sensors 130a-130l in FIG. 13. In some other embodiments, the method M10 detects the pressure force(s) applied by the cone against the cup, and the pressure force of the cone is detected by the pressure sensors 330a-330l in FIG. 10. Of course, the method M10 can detects the pressure forces applied by the cone against the wafer and the cup.

The method M10 of FIG. 15 further includes operation S18: stop clamping the wafer when the pressure force is higher than a predetermined value. In some embodiments, if the pressure forces of the pressure sensors are higher than a maximum predetermined value, then the method M10 is to stop the motion of the cone, such that the cone stops pressing the wafer. In some embodiments, if the pressure forces of the pressure sensors are lower than a minimum predetermined value, then the method M10 is to keep the motion of the cone until the pressure forces are higher than the minimum predetermined value. In some embodiments, if the difference value between the maximum and minimum pressure forces of the pressure sensors is higher than a predetermined difference value, then the method M10 is to stop the motion of the cone, such that the cone stops pressing the wafer. In still some other embodiments, however, the method M10 stops the motion of the cone when the difference value is higher than the predetermined difference value even though at least one of pressure forces of the pressure sensors is lower than the minimum predetermined value.

In some embodiments, if the difference between the maximum and minimum pressure forces of the pressure sensors is higher than the predetermined difference value, the method M10 further includes withdrawing the cone from the cup, and calibrating the position of the wafer. Hence, the wafer can be flat in the cup. Furthermore, the method M10 may further include calibrating the wafer centering mechanism of the clamshell to allow the wafer in the correct position.

After the inspection is complete, the clamshell with the wafer can be disposed in the plating solution of the plating bath 220 to process the electroplating process. With such inspection method, the clamshell can prevent the wafer from being broken in real time, and the yield of the wafer can be improved.

Figure 16:
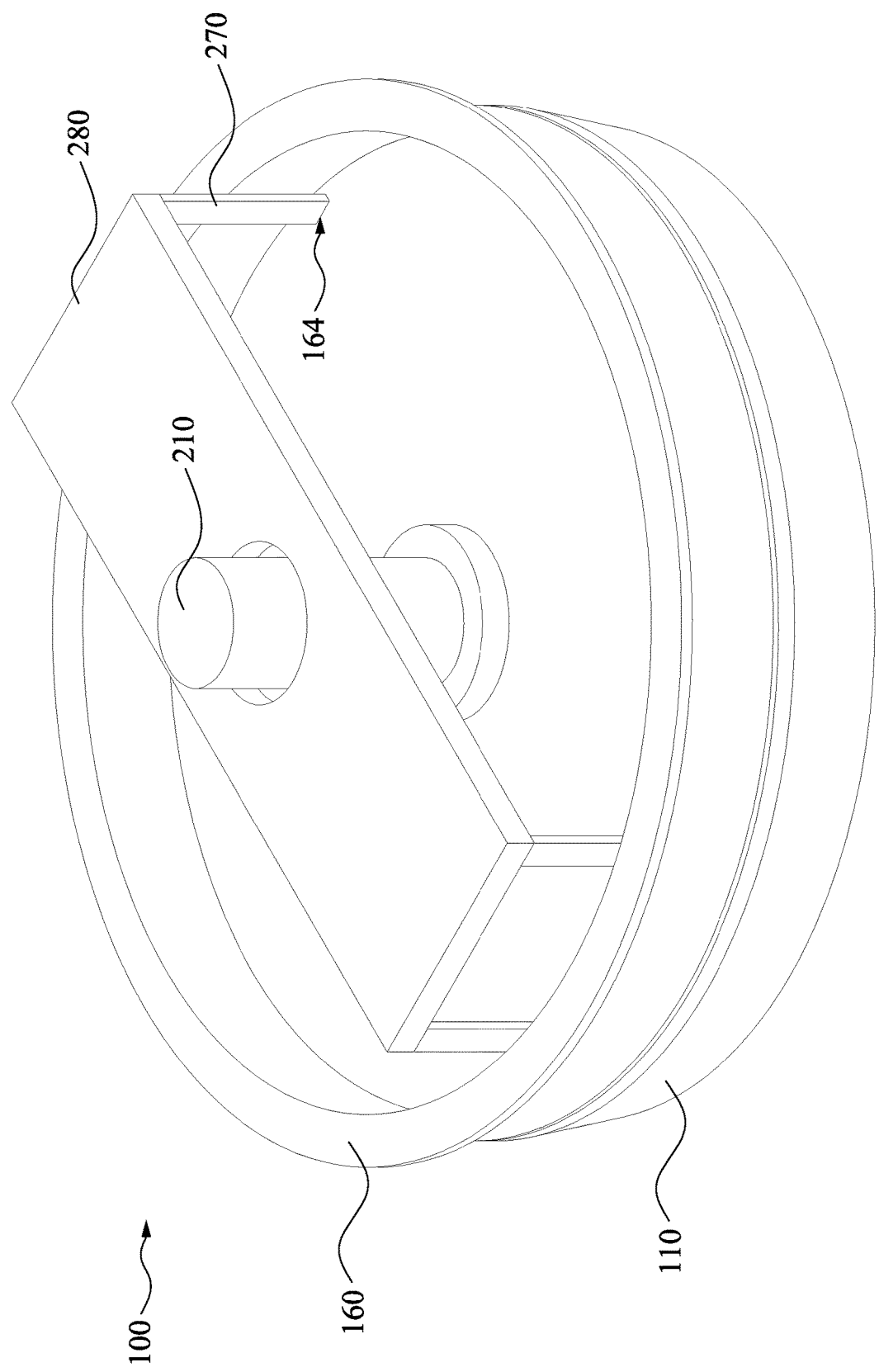
FIG. 16 is a perspective view of the clamshell and the spindle of the electroplating apparatus of FIG. 1 according to some embodiments.

FIG. 16 is a perspective view of the clamshell 100 and the spindle 210 of the electroplating apparatus 10 of FIG. 1 according to some embodiments. The cup 110 is fixedly attached to the spindle 210 by struts 270 and a top plate 280. The cone 160 is attached to a shaft extending into the spindle 210 and thereby to spindle. The cone 160 is capable of vertical movement relative to the shaft by an air actuated cylinder.

Reference is made to FIGS. 11 and 16. An electrical connection is made to the conductive ring 128 of the cup 110 through the struts 270 that extend from a top surface of the conductive ring 128. The struts 270 are made from an electrically conductive material, and act as a conductor through which electrical current reaches the conductive ring 128. In some embodiments, the struts 270 may be coated with an insulating coating. The struts 270 also structurally connect the cup 110 to a vertical drive mechanism (not shown) that allows the cup 110 to be lifted from and lowered into a plating solution, and also connect the cup 110 to a rotational drive mechanism.

Figure 17:
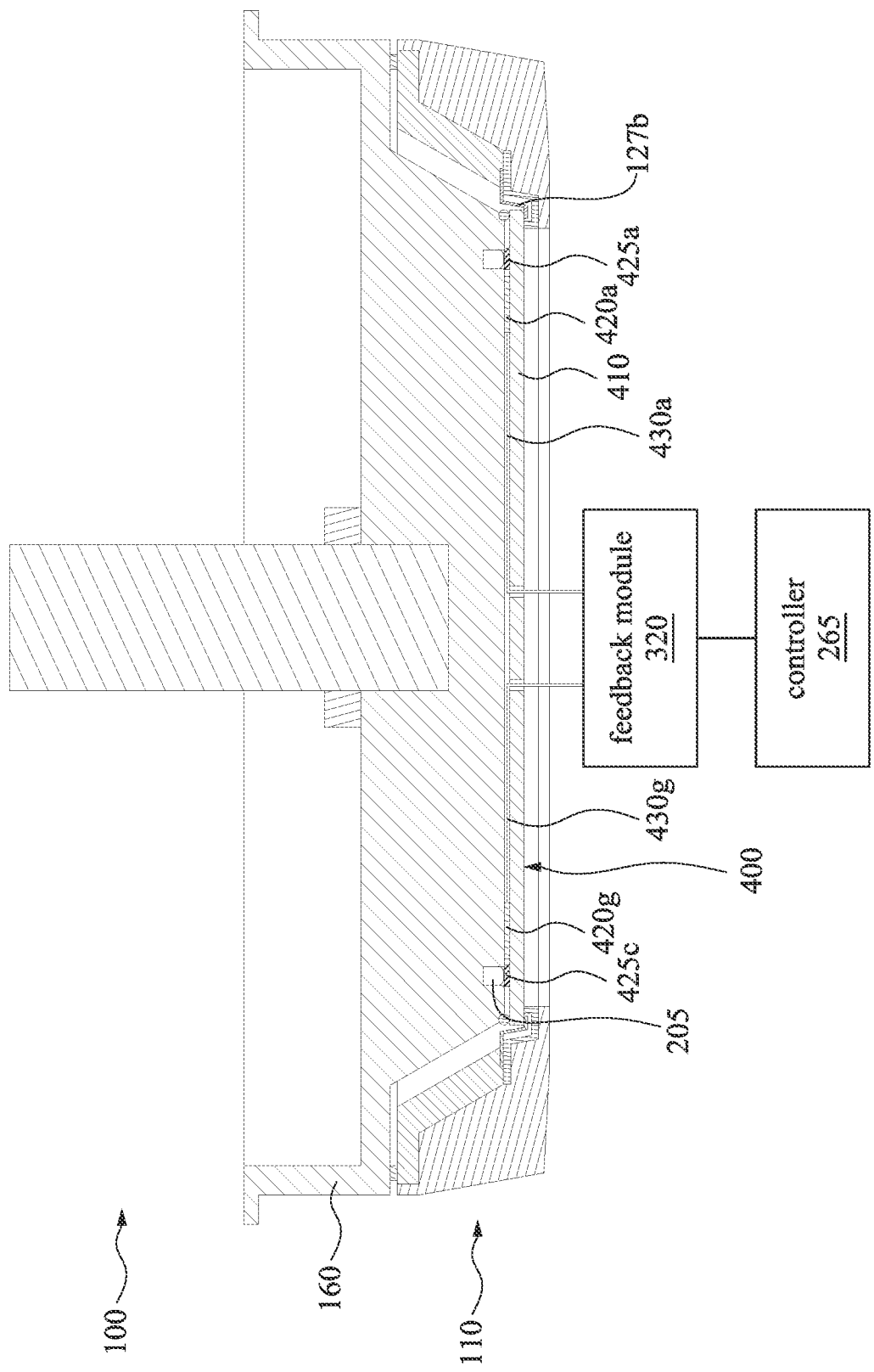
FIG. 17 is a cross-sectional view of the clamshell of FIG. 1 and a pressure inspection element in accordance with some embodiments of the present disclosure.
Figure 18:
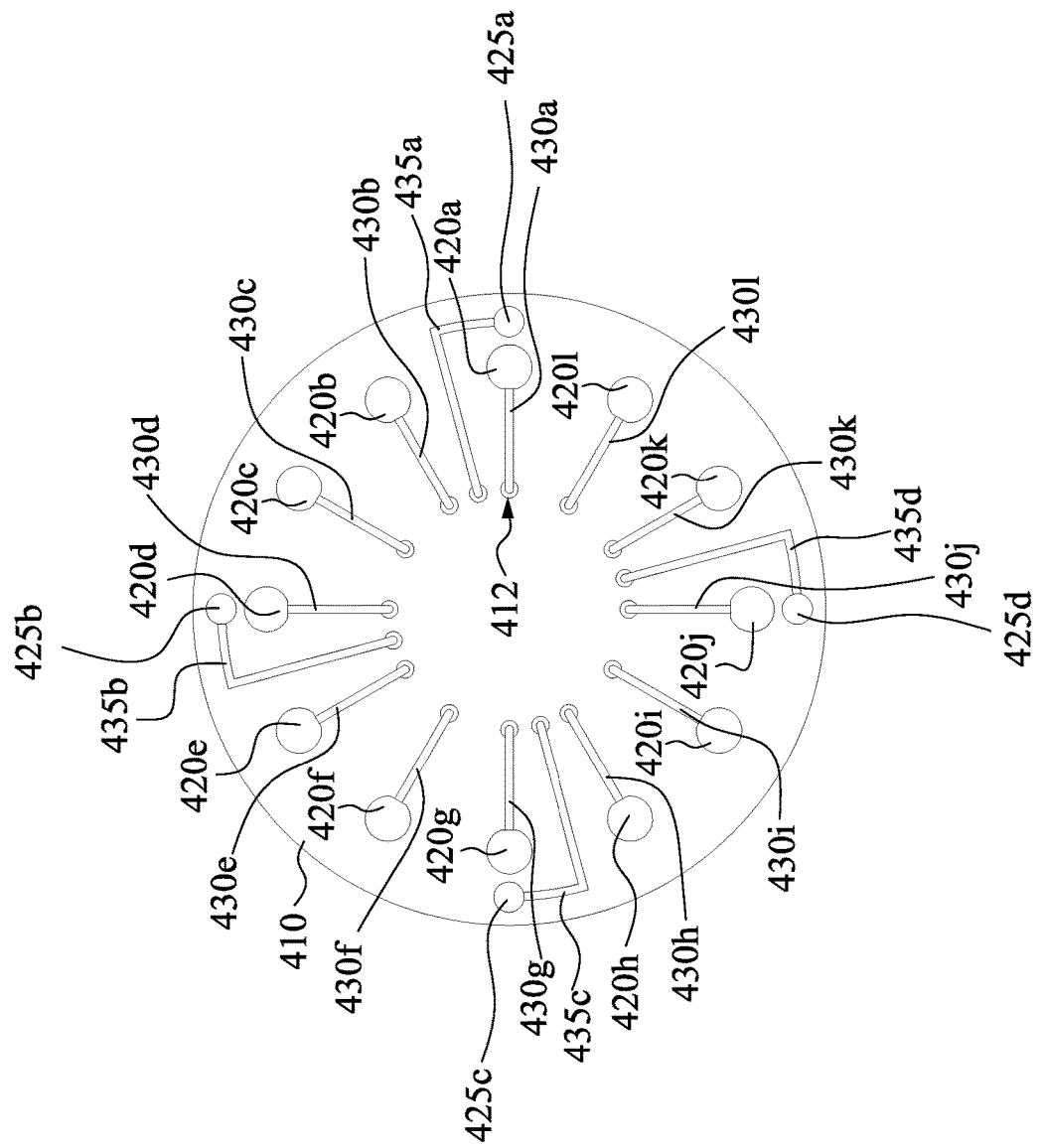
FIG. 18 is a top view of the pressure inspection element in FIG. 17.

FIG. 17 is a cross-sectional view of the clamshell 100 of FIG. 1 and a pressure inspection element 400 in accordance with some embodiments of the present disclosure, and FIG. 18 is a top view of the pressure inspection element 400 in FIG. 17. In some embodiments, the pressure inspection element 400 can inspect the pressure generated by the cone 160 in advance (before disposing the wafer in the cup 110). Specifically, the pressure inspection element 400 includes a substrate 410 and a plurality of pressure sensors 420a-420l disposed on the substrate 410. The substrate 410 may have a size similar to that of the wafer that is configured to be performed the electroplating process. In some embodiments, the substrate 410 may be made of transparent materials, such as glass or plastic. In some other embodiments, the substrate 410 may be made of opaque materials. The pressure sensors 420a-420l are arranged as a circle in some embodiments. In some embodiments, the pressure sensors 420a-420l are substantially equidistant from each other. The pressure sensor 420a is opposite to the pressure sensor 420g, the pressure sensor 420b is opposite to the pressure sensor 420h, the pressure sensor 420c is opposite to the pressure sensor 420i, the pressure sensor 420d is opposite to the pressure sensor 420j, the pressure sensor 420e is opposite to the pressure sensor 420k, and the pressure sensor 420f is opposite to the pressure sensor 420l. It is noted that the number of the pressure sensors shown in FIG. 18 is for illustrative purposes, and should not limit the present disclosure. Embodiments fall within the present disclosure if the number of the pressure sensors is greater than one.

During the inspection process, the pressure inspection element 400 is disposed between the cone 160 and the cup 110. In other words, the cone 160 and the cup 110 together clamp the pressure inspection element 400. The contacts 127b of the cup 110 is in contact with the substrate 410 of the pressure inspection element 400, and the pressure sensors 420a-420l are disposed between the substrate 410 and the cone 160. When the cone 160 presses the pressure inspection element 400, the pressure sensors 420a-420l touches the cone 160. The pressure sensors 420a-420l begin to detect pressure forces when the cone 160 continuously press the pressure inspection element 400. The pressure sensors 420a-420l can sense whether the cone 160 press the pressure inspection element 400 too much (whether the pressure forces of the pressure sensors 420a-420l are higher than a maximum predetermined value), whether the cone 160 does not clamp the pressure inspection element 400 well (whether the pressure forces of the pressure sensors 420a-420l are lower than a minimum predetermined value), or whether the pressure inspection element 400 is not flat (whether the difference between the maximum and minimum pressure forces of the pressure sensors 420a-420l is higher than a predetermined difference value).

In some embodiments, the pressure inspection element 400 further includes a plurality of plunger pressure sensors 425a-425d disposed on the substrate 410. The plunger pressure sensors 425a-425d are respectively in contact with the plungers 205 when the cone 160 presses the pressure inspection element 400. The plunger pressure sensors 425a-425d can inspect the pressure forces that the plungers 205 push the substrate 410 (and so does the wafer 90). It is noted that although in FIG. 18, the plunger pressure sensors 425a-425d are disposed between the pressure sensors 420a-420l and the perimeter of the substrate 410, in some other embodiments, each of the plunger pressure sensors 425a-425d may be disposed between adjacent two pressure sensors 420a-420l or at least one of the pressure sensors 420a-420l may be disposed between the perimeter of the substrate 410 and one of the plunger pressure sensors 425a-425d.

The pressure sensors 425a-425d can detect whether the plungers 205 pushes the substrate 410 (so does the wafer 90) too much (if the pressure forces are too high) and detect whether the plungers 205 are workable (if the pressure forces are too low), e.g., whether the plungers 205 lose their elasticity. In some embodiments, the pressure forces of the plunger pressure sensors 425a-425d are higher than the pressure forces of the pressure sensors 420a-420l. The pressure forces of the pressure sensors 425a-425d can be compared with the pressure forces of the pressure sensors 420a-420l. For example, the pressure forces of the pressure sensors 425a-425d may be about 0.5 times to about 10 times of the pressure force of one of the pressure sensors 420a-420l. The plunger(s) 205 may lose its (or their) elasticity if the pressure force(s) of the pressure sensor(s) 425a-425d is(are) lower than about 0.5 times of one of the pressure forces of the pressure sensors 420a-420l. Furthermore, the plunger(s) 205 may press the wafer 90 too much if the pressure force(s) of the pressure sensor(s) 425a-425d is(are) greater than about 10 times of one of the pressure forces of the pressure sensors 420a-420l.

The pressure sensors 420a-420l and the plunger pressure sensors 425a-425d can be electrically connected to a feedback module 320, and the feedback module 320 can be electrically connected to a controller 265. In some embodiments, the pressure sensors 420a-420l are electrically connected to the feedback module 320 respectively through wires 430a-430l, and the plunger pressure sensors 425a-425d are electrically connected to the feedback module 320 respectively through wires 435a-435d. In some embodiments, the substrate 410 further include a plurality of through holes 412, and the wires 430a-430l and 435a-435d pass through the through holes 412 to be connected to the feedback module 320.

Figure 19:
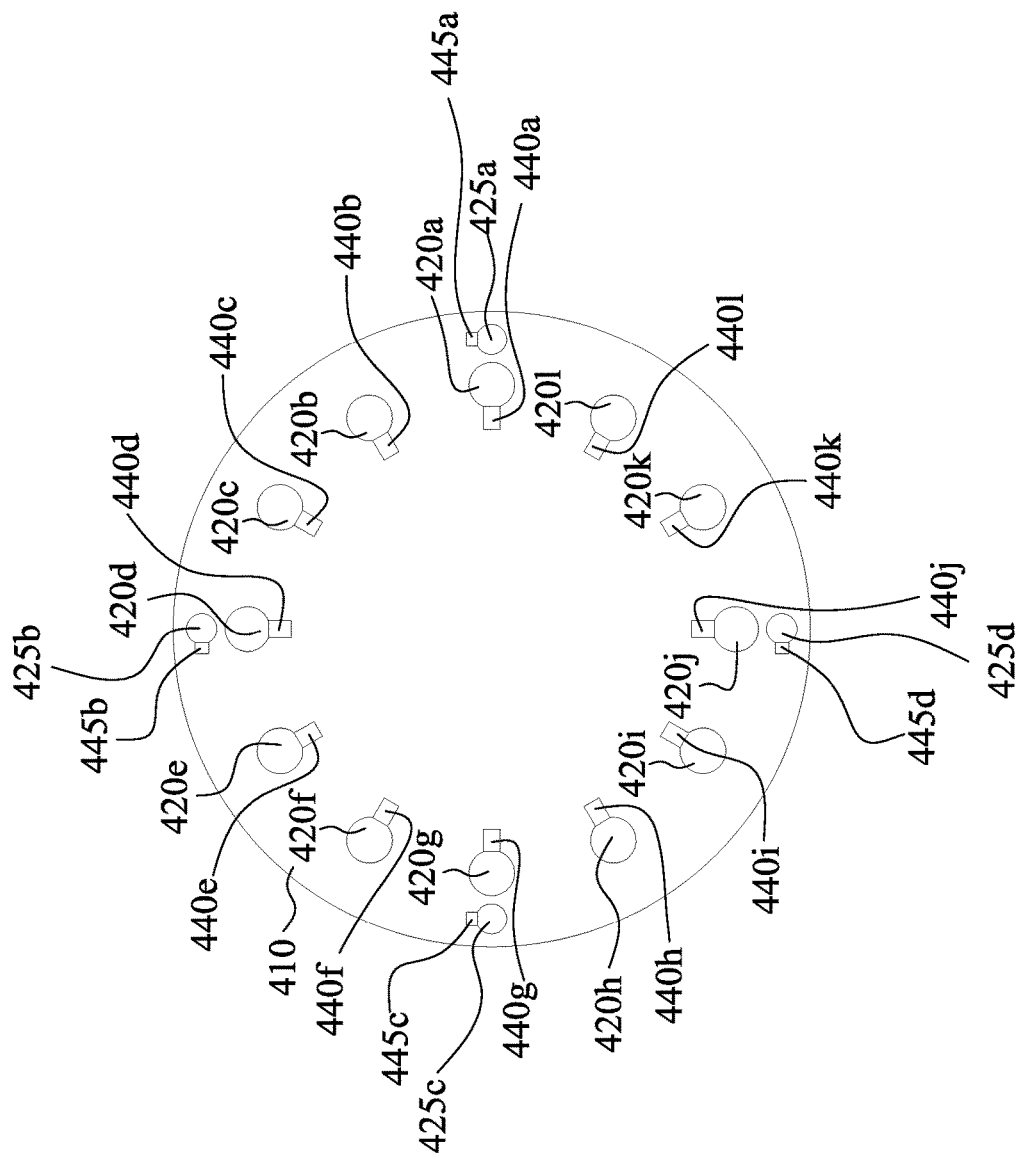
FIG. 19 is a top view of the inspection element in accordance with some embodiments of the present disclosure.

FIG. 19 is a top view of the inspection element 400 in accordance with some embodiments of the present disclosure. In some embodiments, the pressure sensors 420a-420l are electrically connected to the feedback module 320 respectively through transmitters 440a-440l, and the plunger pressure sensors 425a-425d are electrically connected to the feedback module 320 respectively through transmitters 445a-445d. The transmitters 440a-440l and 445a-445d transmit the pressure force data of the pressure sensors 420a-420l and the plunger pressure sensors 425a-425d to the feedback module 320. In some other embodiments, one or some of the pressure sensors 420a-420l and 425a-425d can be electrically connected to the feedback module 320 in a wireless manner, and the rest of the pressure sensors 420a-420l and 425a-425d are electrically connected to the feedback module 320 by using wires.

Figure 20:
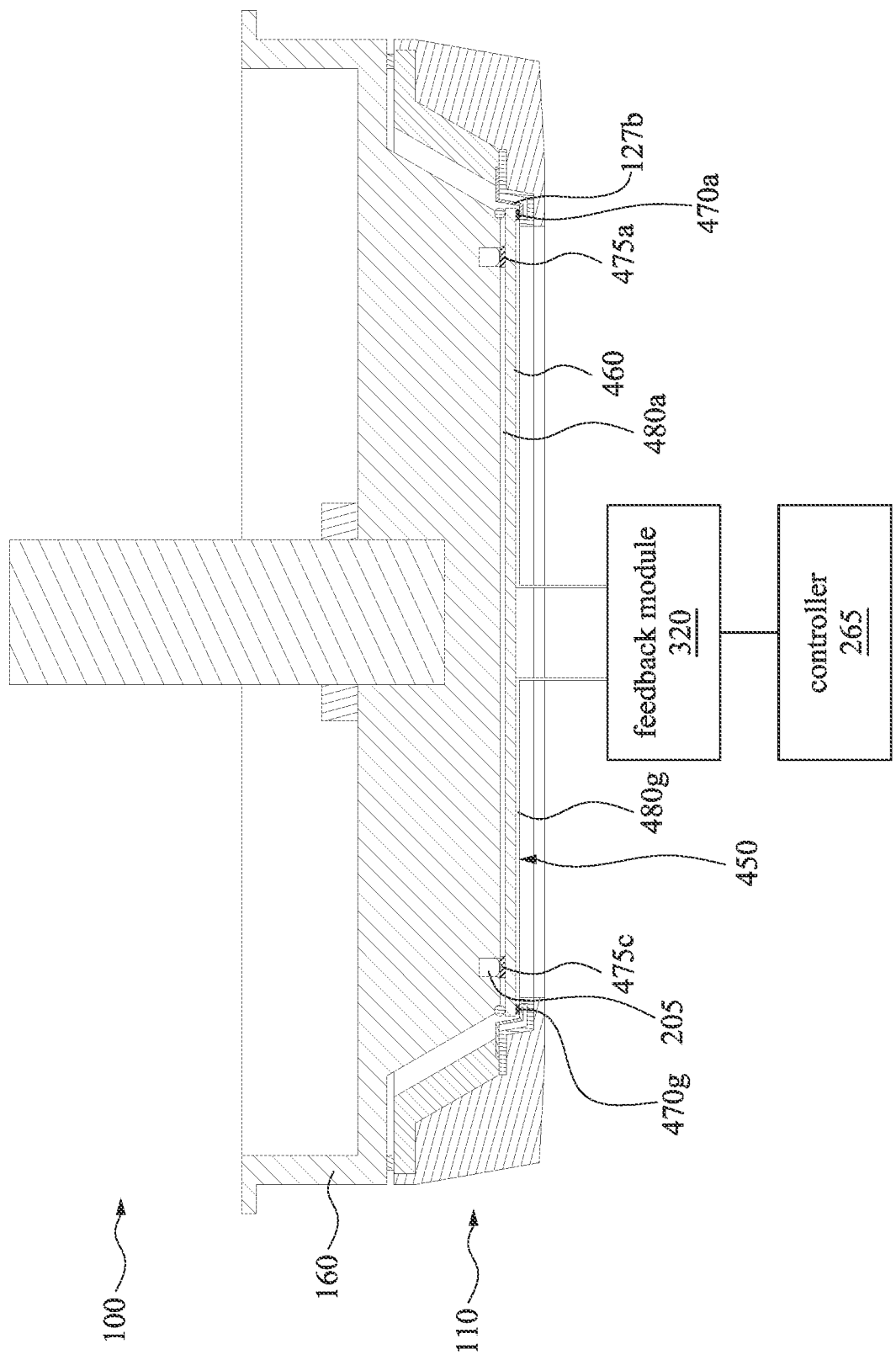
FIG. 20 is a cross-sectional view of the clamshell of FIG. 1 and a pressure inspection element in accordance with some embodiments of the present disclosure.
Figure 21A:
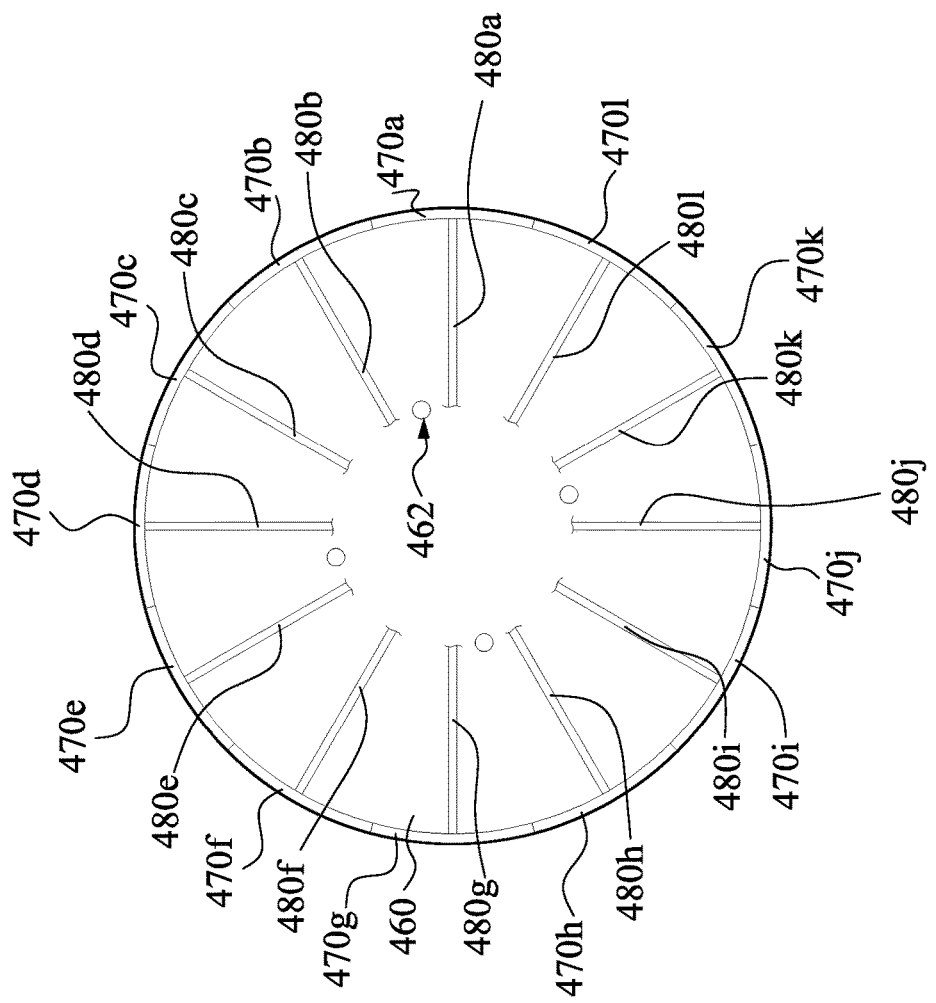
FIG. 21A is a bottom view of the pressure inspection element in FIG. 20.

FIG. 20 is a cross-sectional view of the clamshell 100 of FIG. 1 and a pressure inspection element 450 in accordance with some embodiments of the present disclosure, and FIG. 21A is a bottom view of the pressure inspection element 450 in FIG. 20. In some embodiments, the pressure inspection element 450 can inspect the pressure generated by the cone 160 in advance. Specifically, the pressure inspection element 450 includes a substrate 460 and a plurality of pressure sensors 470a-470l disposed beneath the substrate 460. The substrate 460 may have a size similar to that of the wafer that is configured to be performed the electroplating process. The pressure sensors 470a-470l are arranged as a circle in some embodiments. The pressure sensors 470a-470l may be adjacent to each other or may be separated from each other. The pressure sensor 470a is opposite to the pressure sensor 470g, the pressure sensor 470b is opposite to the pressure sensor 470h, the pressure sensor 470c is opposite to the pressure sensor 470i, the pressure sensor 470d is opposite to the pressure sensor 470j, the pressure sensor 470e is opposite to the pressure sensor 470k, and the pressure sensor 470f is opposite to the pressure sensor 470l. It is noted that the number of the pressure sensors shown in FIG. 21A is for illustrative purposes, and should not limit the present disclosure. Embodiments fall within the present disclosure if the number of the pressure sensors is greater than one.

During the inspection process, the pressure inspection element 450 is disposed between the cone 160 and the cup 110. In other words, the cone 160 and the cup 110 together clamp the pressure inspection element 450. The contacts 127b of the cup 110 is in contact with the pressure sensors 470a-470l of the pressure inspection element 450, and the pressure sensors 470a-470l are disposed between the substrate 410 and the cup 110. When the cone 160 presses the pressure inspection element 450, the pressure sensors 470a-470l touches the contacts 127b. The pressure sensors 470a-470l begin to detect pressure forces when the cone 160 continuously press the pressure inspection element 450. The pressure sensors 470a-470l can sense whether the cone 160 press the pressure inspection element 450 too much (whether the pressure forces of the pressure sensors 470a-470l are higher than a maximum predetermined value), whether the cone 160 does not clamp the pressure inspection element 450 well (whether the pressure forces of the pressure sensors 470a-470l are lower than a minimum predetermined value), or whether the pressure inspection element 450 is not flat (whether the difference between the maximum and minimum pressure forces of the pressure sensors 470a-470l is higher than a predetermined difference value).

Figure 21B:
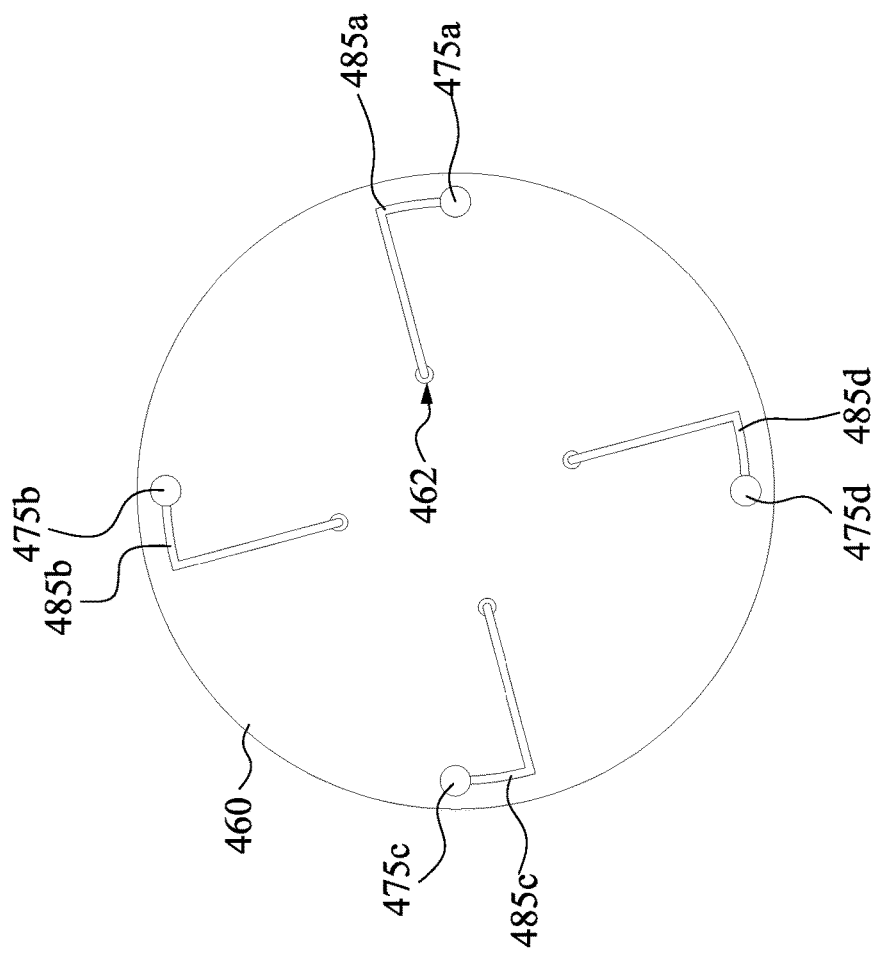
FIG. 21B is a top view of the pressure inspection element in FIG. 20.

FIG. 21B is a top view of the pressure inspection element 450 in FIG. 20. Reference is made to FIGS. 20 and 21B. In some embodiments, the pressure inspection element 450 further includes a plurality of plunger pressure sensors 475a-475d disposed on the substrate 460. The plunger pressure sensors 475a-475d are respectively in contact with the plungers 205 when the cone 160 presses the pressure inspection element 450. The plunger pressure sensors 475a-475d can inspect the pressure forces that the plungers 205 push the substrate 460 (and so does the wafer 90).

Reference is made to FIGS. 20-21B. The pressure sensors 470a-470l and the plunger pressure sensors 475a-475d can be electrically connected to a feedback module 320, and the feedback 320 can be electrically connected to a controller 265. In some embodiments, the pressure sensors 470a-470l are electrically connected to the feedback module 320 respectively through wires 480a-480l, and the plunger pressure sensors 475a-475d are electrically connected to the feedback module 320 respectively through wires 485a-485d.

In some embodiments, the substrate 460 further include a plurality of through holes 462, and the wires 485a-485d pass through the through holes 462 to connected to the feedback module 320. In some other embodiments, the pressure sensors 470a-470l and 475a-475d are electrically connected to the feedback module 320 respectively through transmitters. In some other embodiments, one or some of the pressure sensors 470a-470l and 475a-475d can be electrically connected to the feedback module 320 in a wireless manner, and the rest of the pressure sensors 470a-470l and 475a-475d are electrically connected to the feedback module 320 by using wires.

Figure 22:
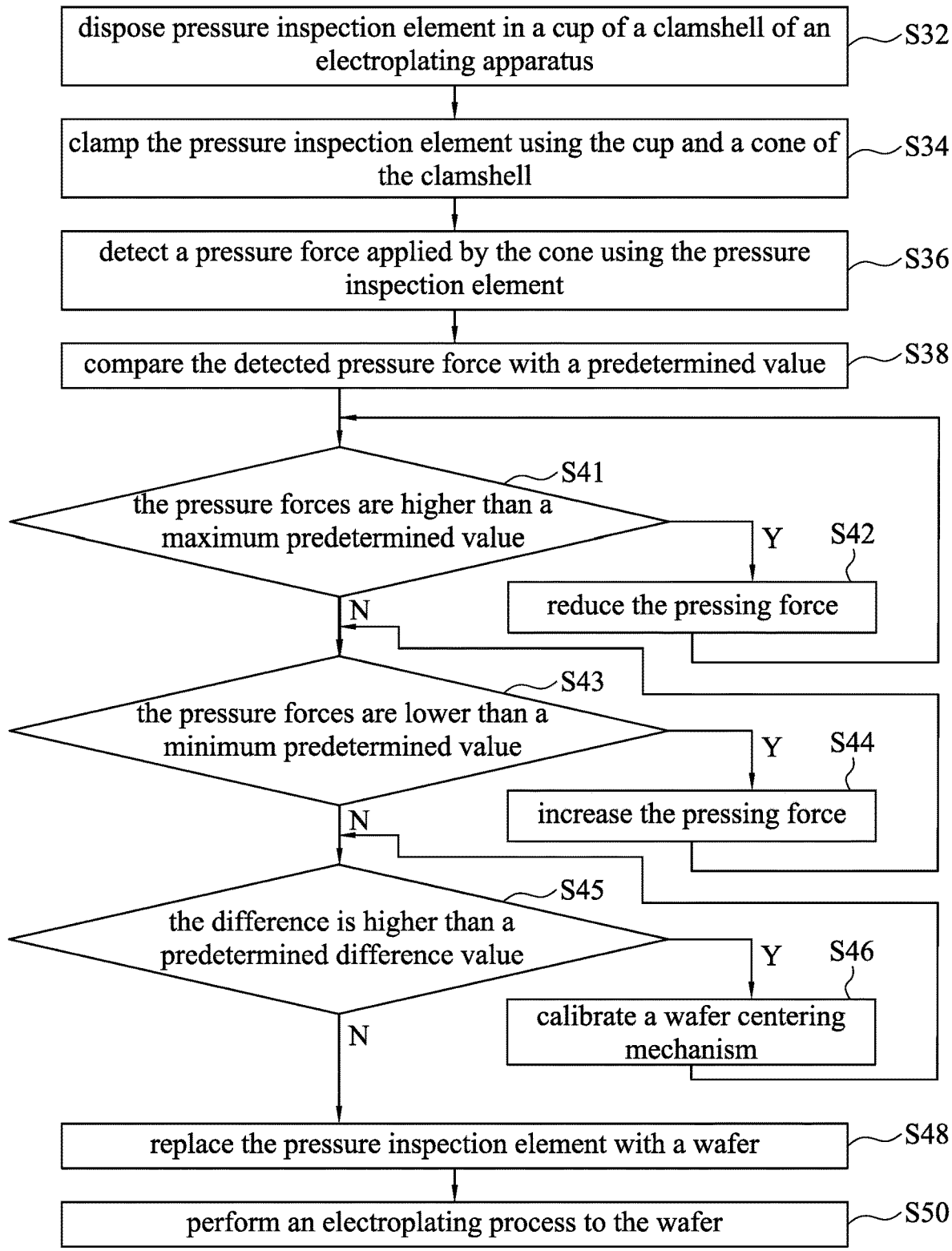
FIG. 22 is a flow chart of a method for inspecting the pressure force applied by a cone according to some embodiments.

FIG. 22 is a flow chart of a method M30 for inspecting the pressure force applied by the cone according to some embodiments. The method M30 is merely an example, and is not intended to limit the present disclosure beyond what is explicitly recited in the claims. Additional operations can be provided before, during, and after the method M30, and some operations described can be replaced, eliminated, or moved around for additional embodiments of the process. For clarity and ease of explanation, some elements of the figures have been simplified.

Method M30 includes operation S32: disposing a pressure inspection element in a cup of a clamshell of an electroplating apparatus. The pressure inspection elements 400 and 450 respectively shown in FIGS. 17 and 20 can be applied in this embodiment. Furthermore, in some embodiments, the pressure inspection element may be inclined if the wafer centering mechanism (see FIG. 11) of the cup does not function well, e.g., the wafer centering mechanism may be twisted and make the pressure inspection element in the wrong position.

The method M30 of FIG. 22 further includes operation S34: clamping the pressure inspection element using the cup and a cone of the clamshell. In some embodiments, as shown in FIG. 17, the cone 160 presses the pressure inspection element 400 downwardly, such that the cone 160 and the cup 110 together clamp the pressure inspection element 400.

The method M30 of FIG. 22 further includes operation S36: detecting a pressure force applied by the cone using the pressure inspection element. In some embodiments, the method M30 detects the pressure force(s) applied by the cone against the wafer, and the pressure force of the cone is detected by the pressure sensors 420a-420l in FIG. 17 and/or the pressure sensors 470a-470l in FIG. 20.

The method M30 of FIG. 22 further includes operation S38: comparing the detected pressure force with a predetermined value. In some embodiments, if the pressure forces of the pressure sensors are higher than a maximum predetermined value (operation S41), then the method M30 further includes operation S42: reducing the pressing force of the cone. In some embodiments, if the pressure forces of the pressure sensors are lower than a minimum predetermined value (operation S43), then the method M30 further includes operation S44: increasing the pressing force of the cone until the pressure forces are higher than the minimum predetermined value. In some embodiments, if the difference between the maximum and minimum pressure forces of the pressure sensors is higher than a predetermined difference value (operation S45), then the method M30 further includes operation S46: calibrating a wafer centering mechanism of the clamshell to allow the pressure inspection element in the correct position. In some embodiments, if the pressure force is not beyond the aforementioned values, then the method M30 further includes operation S48: replacing the pressure inspection element with a wafer. As such, the pressing force of the cone can be inspected before the wafer is placed in the clamshell. In some embodiments, the method M30 further includes operation S50: performing an electroplating process to the wafer. In some embodiments, the sequence of the operations S41, S43, and S45 may be switched, and/or one or some of the operations S41, S43, and S45 may be omitted.

Figure 23:
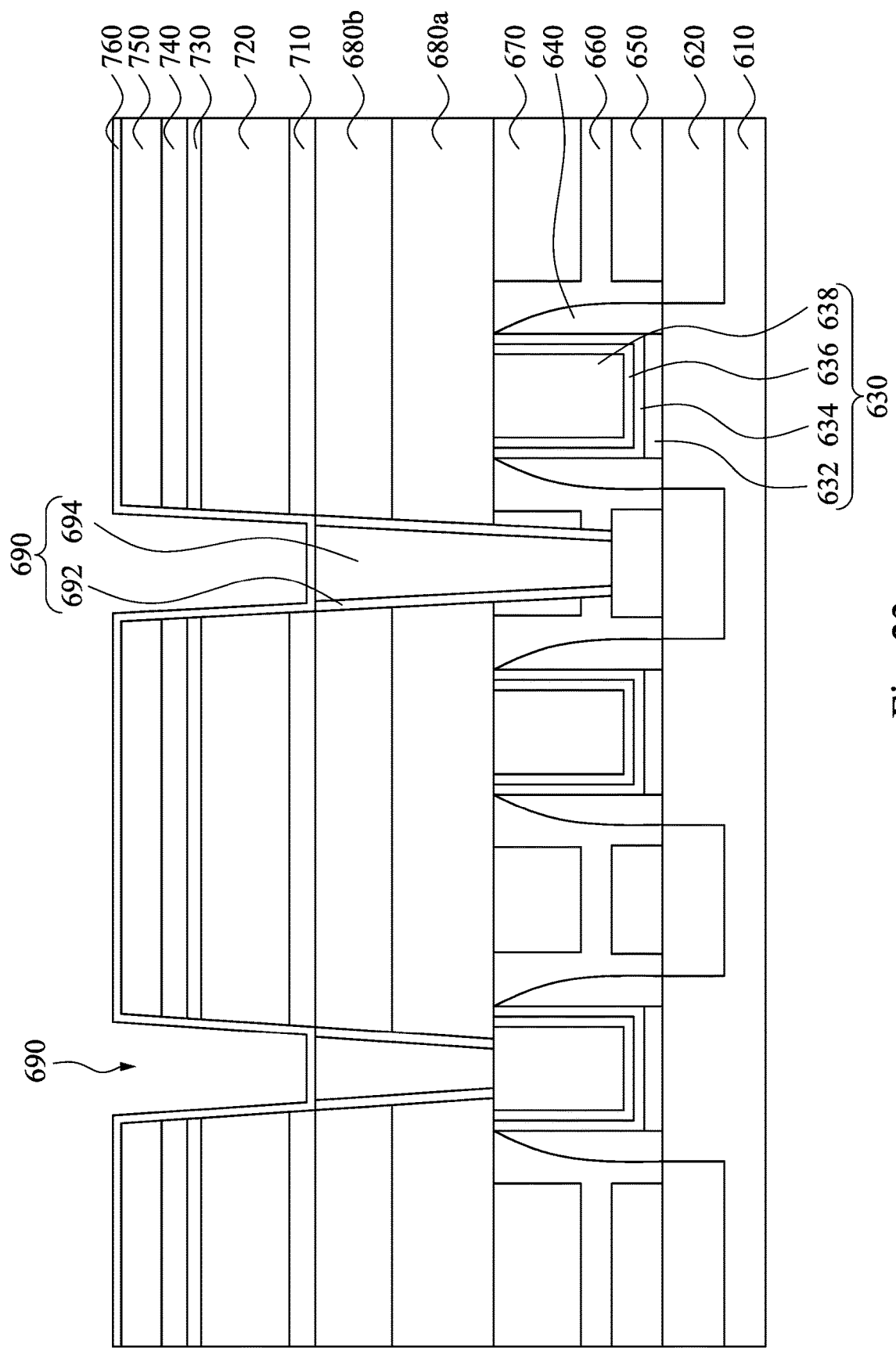
FIGS. 23-25 are cross-sectional diagrams illustrating an electroplating method of fabricating a dual damascene interconnect structure in accordance with various aspects of the present disclosure.
Figure 24:
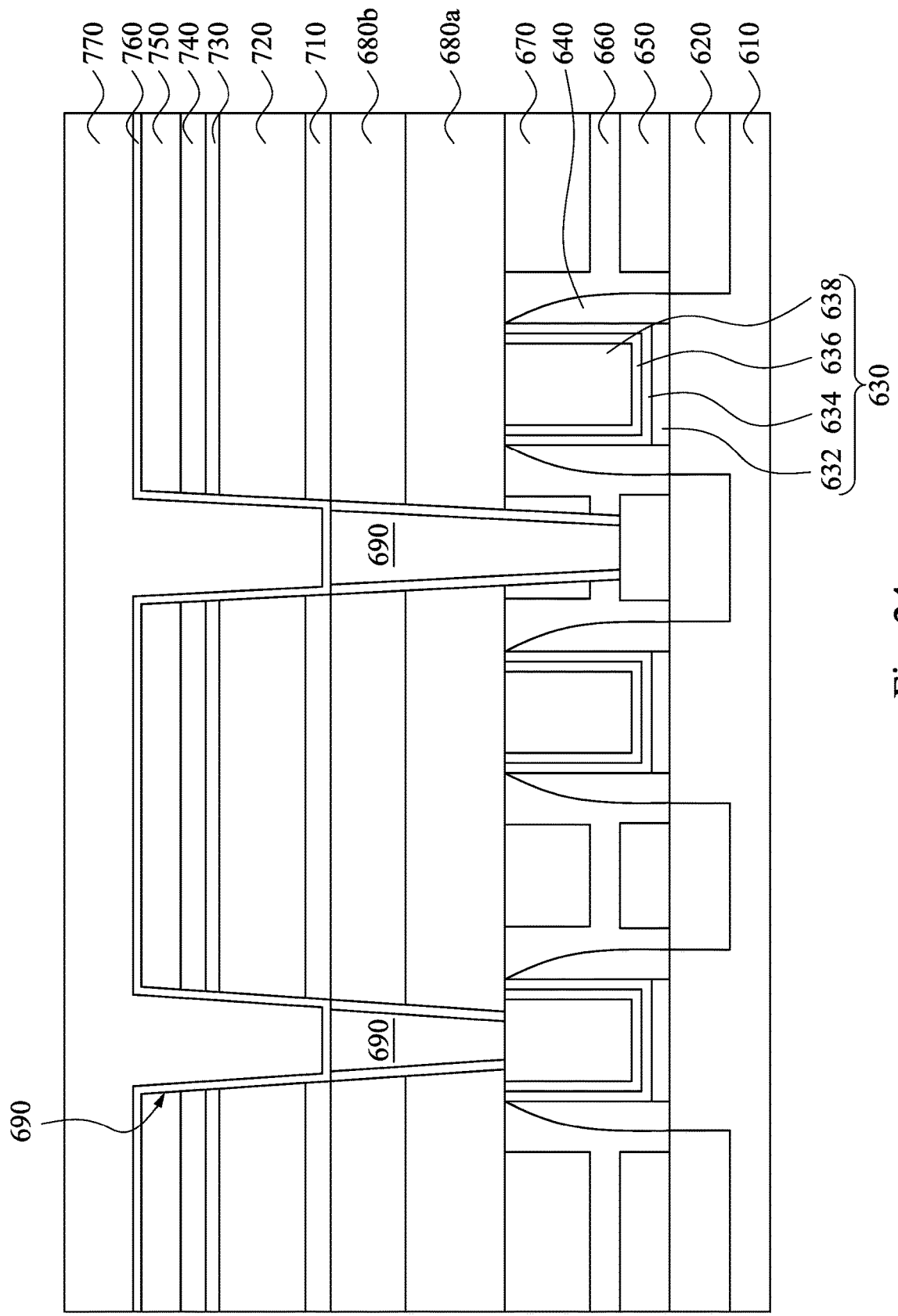
Figure 25:
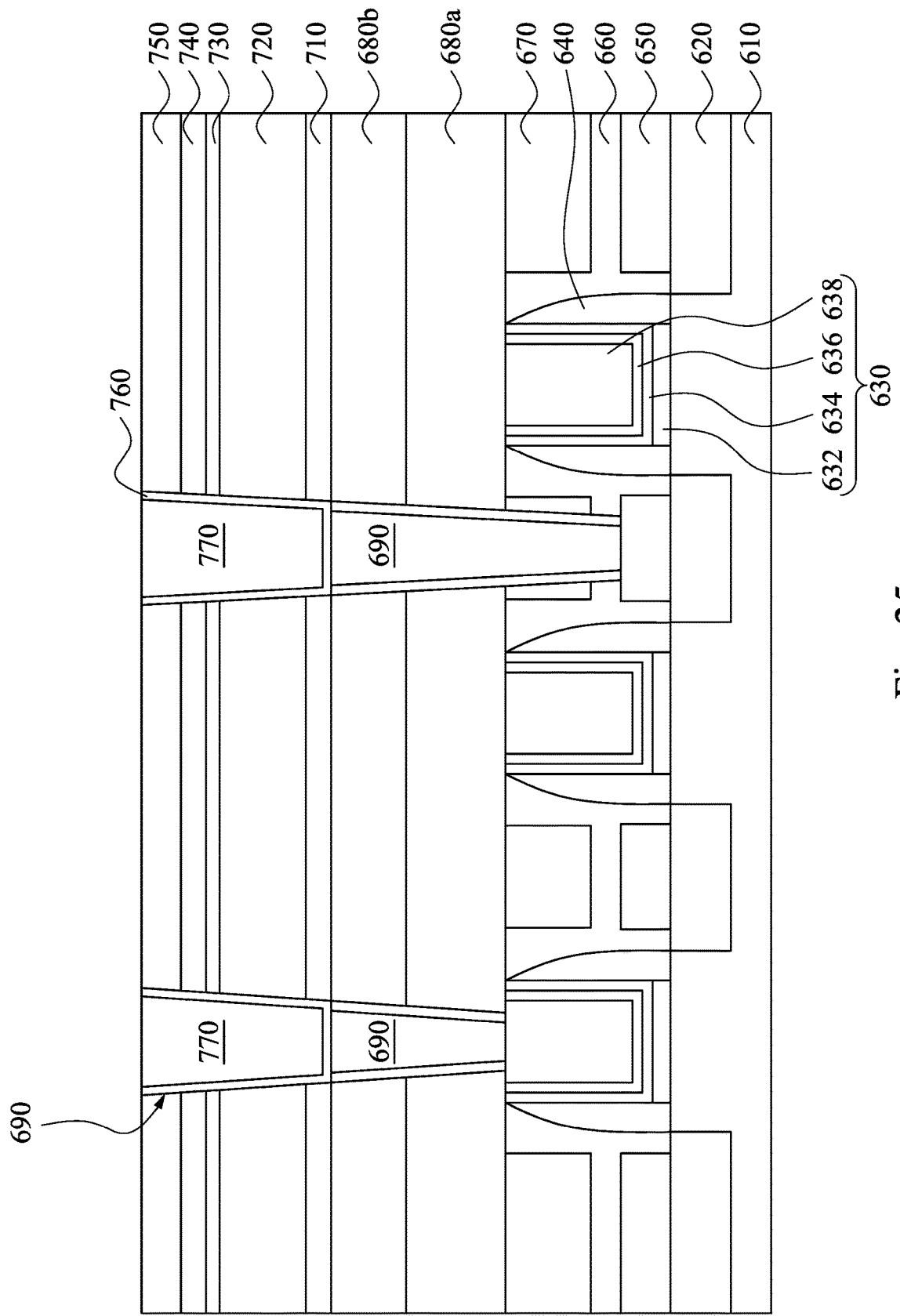

FIGS. 23-25 are cross-sectional diagrams illustrating an electroplating method of fabricating a dual damascene interconnect structure in accordance with various aspects of the present disclosure. In some embodiments, the method includes physical vapor deposition of a barrier layer over the feature surfaces, and a conductive metal seed layer, such as copper, over the barrier layer, followed by electroplating a conductive metal, such as copper, over the seed layer to fill the interconnect structure/feature. Following, the deposited layers and the dielectric layers may be planarized, e.g., by chemical mechanical polishing (CMP), to define a conductive interconnect feature.

Reference is made to FIG. 23. A substrate 610 is provided. A plurality of source/drain features 620 are formed in the substrate 610. A plurality of gate structures 630 are formed on the substrate 610 and between the adjacent source/drain features 620. In some embodiments, the gate structure 630 includes a gate dielectric layer 632, a high-k dielectric layer 634, at least one metal layer 636, and a filling metal 638. A spacer structure 640 surrounds the gate structure 630. Metal alloy layers 650 are respectively formed on the source/drain features 620. A contact etching stop layer (CESL) 660 is formed to cover the gate structure 630, the spacer structure 640, and the metal alloy layers 650. An interlayer dielectric (ILD) 670 is formed on the CESL 660.

The substrate 610 may be made of semiconductor materials such as silicon. The source/drain features 620 may be doped region in the substrate 610 or may be epitaxial layers. The gate dielectric layer 632, the spacer structure 640, the CESL 660, and the ILD 670 may be made of dielectric materials. The filling metal 638 may be made of Al or other suitable materials. The metal alloy layers 650 may be a silicide layer (e.g., NiSi). It is noted that the materials mentioned above are illustrative and should not limit the present disclosure.

Furthermore, a plurality of ILDs 680a and 680b are formed on the ILD 670 and the CESL 660. Subsequently, a plurality of contacts 690 are formed in the ILDs 680a and 680b and respectively in contact with the gate structure 630 and the metal alloy layer 650. The contact 690 includes an adhesive layer 692 and a filling metal 694 disposed on the adhesive layer 692. The ILD 680a may be made of tetraethyl-ortho-silicate (TEOS), and the ILD 680b may be made of high density plasma (HDP) phosphor-silicate glass (PSG). The contacts 690 may be made of tungsten. It is noted that the materials mentioned above are illustrative and should not limit the present disclosure.

Then, a barrier layer 710, an extreme low-k dielectric layer 720, an extreme super low-k dielectric layer 730, an anti-reflective layer 740, and a dielectric layer 750 are sequentially formed on the ILD 680b and the contacts 690. Subsequently, a plurality of openings 705 are formed in the layers 720-750 to respectively expose the contacts 690. Then, a barrier layer 760 is conformally formed in the openings 705 and on the dielectric layer 750. The barrier layer 710 may be made of SiC and may be an oxygen barrier coating (OBC), the anti-reflective layer 740 may be a nitrogen free anti-reflection layer, and the barrier layer 760 may be made of TiN. It is noted that the materials mentioned above are illustrative and should not limit the present disclosure.

Reference is made to FIG. 24. A conductive layer 770 such as a copper layer is electroplated over the barrier layer 760 to metalize the dual damascene structure. The conductive layer 770 electrochemically deposited by the electroplating apparatus 10 with controlled plating current or voltage in accordance with various aspects of the present disclosure. In some embodiments, prior to the electroplating, the wafer of FIG. 25 is disposed in the electroplating apparatus 10 (see FIG. 1), and an inspection process mentioned above is performed. Then, the pressure applied by the cone 160 during electroplating is adjusted based on the detected pressure forces data. In alternative embodiments, the pressure forces may be determined or obtained in real time while electroplating, and the pressure forces may be adjusted in real time based on the determined or obtained pressure forces. In some embodiments, the present disclosure provides for an electroplating process substantially without breaking the wafer.

Reference is made to FIG. 25. The top portion of the processed substrate, i.e., the exposed electroplated conductive layer 770 (shown in FIG. 24), may then be planarized, for example by chemical mechanical polishing (CMP). During planarization, portions of the barrier layer 760, the conductive layer 770, and a top surface of the dielectric layer 750 are removed from the top surface of the substrate 610, leaving a planar surface with conductive interconnect features, such as a dual damascene structure.

According to some embodiments, a pressure inspection process is performed before or during the electroplating process. The pressure inspection process can prevent the wafer from broken because of huge pressing force and/or the wafer in the wrong position. Furthermore, a pressure inspection element can be disposed in the clamshell to measure the pressing force of the cone.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the disclosure.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

According to some embodiments, a method includes disposing a wafer in a cup of a clamshell of an electroplating apparatus. The wafer is clamped using the cup and a cone of the clamshell. A pressure force applied by the cone against the wafer is detected. Stopping clamping the wafer when the pressure force is higher than a predetermined value.

In some embodiments, the method further includes keeping clamping the wafer until the detected pressure force is higher than the predetermined value.

In some embodiments, detecting the pressure force applied by the cone against the wafer includes detecting pressure forces at two different positions between the cone and the wafer.

In some embodiments, the method further includes calibrating a position of the wafer after stopping clamping the wafer.

In some embodiments, the method further includes calibrating a position of a wafer centering mechanism of the clamshell after stopping clamping the wafer.

In some embodiments, the method further includes disposing a pressure sensor on a pressing surface of the cone before clamping the wafer, wherein the pressing surface of the cone faces the wafer.

In some embodiments, the method further includes disposing a pressure sensor between the cone and the cup before clamping the wafer.

In some embodiments, the method further includes disposing a pressure sensor under a contact of the cup before clamping the wafer, wherein the contact is in contact with the wafer when clamping the wafer.

In some embodiments, the method further includes disposing the wafer and the clamshell into a plating solution after stopping clamping the wafer.

According to some embodiments, a method includes disposing a pressure inspection element in a cup of a clamshell of an electroplating apparatus. The pressure inspection element comprises a substrate and a plurality of pressure sensors on the substrate. The pressure inspection element is clamped using the cup and a cone of the clamshell. A pressure force applied by the cone using the pressure sensors of the pressure inspection element is detected. The detected pressure force is compared with a predetermined value. The inspecting device is replaced with a wafer after comparing the detected pressure force with the predetermined value.

In some embodiments, detecting the pressure forces includes detecting the pressure forces between the cone and the substrate of the pressure inspection element.

In some embodiments, detecting the pressure forces includes detecting the pressure forces between the substrate of the pressure inspection element and the cup.

In some embodiments, the method further includes performing an electroplating process to the wafer.

In some embodiments, comparing the detected pressure force with the predetermined value includes reducing a pressing force of the cone when the pressure force is higher than the predetermined value.

In some embodiments, comparing the detected pressure force with the predetermined value includes increasing a pressing force of the cone when the pressure force is lower than the predetermined value.

In some embodiments, the method further includes calibrating a wafer centering mechanism of the clamshell when a difference between two pressure forces is higher than the predetermined value.

According to some embodiments, a device for an electroplating apparatus includes a cup, a cone, a plurality of pressure sensors, a feedback module, and a controller. The cup is configured to support a wafer. The cone is over the cup and is configured to clamp the wafer with the cup, wherein the cone has a pressing surface facing the cup. The pressure sensors are on the pressing surface. The feedback module is electrically communicated with the pressure sensors to receive and analyze pressure forces detected by the pressure sensors. The controller is electrically connected to the feedback module to control a motion of the cone in a response of an analyzed result of the feedback module.

In some embodiments, the device further includes an o-ring on the pressing surface of the cone and surrounds the pressure sensors.

In some embodiments, the device further includes a plurality of wires interconnect the pressure sensors and the feedback module.

In some embodiments, the device further includes a plurality of transmitters respectively connected to the pressure sensors to transmit pressure forces of the pressure sensors to the feedback module.

The foregoing outline s features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
disposing a pressure inspection element in a cup of a clamshell of an electroplating apparatus, wherein the pressure inspection element comprises a substrate and a plurality of pressure sensors on the substrate;
clamping the pressure inspection element using the cup and a cone of the clamshell;
detecting a pressure force applied by the cone using the pressure sensors of the pressure inspection element to obtain a plurality of pressure force values of the pressure sensors;
comparing the pressure force values with a predetermined value; and
replacing the pressure inspection element with a wafer after comparing the pressure force values with the predetermined value.

2. The method of claim 1, wherein detecting the pressure force comprises detecting the pressure force between the cone and the substrate of the pressure inspection element.

3. The method of claim 1, wherein detecting the pressure force comprises detecting the pressure force between the substrate of the pressure inspection element and the cup.

4. The method of claim 1, further comprising performing an electroplating process to the wafer.

5. The method of claim 1, wherein comparing the pressure force values with the predetermined value comprises reducing a pressing force of the cone when the pressure force values are higher than the predetermined value.

6. The method of claim 1, wherein comparing the pressure force values with the predetermined value comprises increasing a pressing force of the cone when the pressure force values are lower than the predetermined value.

7. The method of claim 1, further comprising calibrating a wafer centering mechanism of the clamshell when a difference between two of the pressure force values is higher than the predetermined value.

8. A method, comprising:
disposing a pressure inspection element in a cup of a clamshell of an electroplating apparatus, wherein the pressure inspection element comprises a substrate and a first pressure sensor on the substrate;
clamping the pressure inspection element using the cup and a cone of the clamshell such that a plunger of the clamshell extends from the cone pushes the first pressure sensor;
detecting a first pressure force applied by the plunger using the first pressure sensors of the pressure inspection element to obtain a first pressure force value of the first pressure sensor;
comparing the first pressure force value with a first predetermined value; and
replacing the pressure inspection element with a wafer after comparing the first pressure force value with the first predetermined value.

9. The method of claim 8, wherein the pressure inspection element further comprises a second pressure sensor on the substrate, and clamping the pressure inspection element is such that the second pressure sensor is between the cone and the substrate, and the method further comprises:
detecting a second pressure force applied by the cone using the second pressure sensor of the pressure inspection element to obtain a second pressure force value of the second pressure sensor; and
determining the first predetermined value based on the second pressure force value.

10. The method of claim 8, wherein the pressure inspection element further comprises a second pressure sensor on the substrate, and clamping the pressure inspection element is such that the second pressure sensor is between the substrate and a contact of the clamshell, and the method further comprises:

detecting a second pressure force applied by the cone using the second pressure sensor of the pressure inspection element to obtain a second pressure force value of the second pressure sensor; and
determining the first predetermined value based on the second pressure force value.

11. The method of claim 8, wherein the pressure inspection element further comprises a plurality of second pressure sensors on the substrate, and the method further comprises:
detecting a second pressure force applied by the cone using the second pressure sensors of the pressure inspection element to obtain second pressure force values of the second pressure sensors; and
comparing the second pressure sensors with a second predetermined value prior to replacing the pressure inspection element with the wafer.

12. The method of claim 11, further comprising reducing a pressing force of the cone when the second pressure force values are higher than the second predetermined value.

13. The method of claim 11, further comprising calibrating a wafer centering mechanism of the clamshell when a difference between two of the second pressure force values is higher than the second predetermined value.

14. The method of claim 8, further comprising performing an electroplating process to the wafer.

15. A method, comprising:
placing a pressure inspection element in a cup of a clamshell of an electroplating apparatus such that a wafer centering mechanism of the cup holds the pressure inspection element in the cup, wherein the pressure inspection element comprises a substrate and a plurality of pressure sensors between the substrate and contacts of the clamshell;
detecting pressure force values of the pressure sensors after placing the pressure inspection element in the cup;
obtaining a difference between a maximum value and a minimum value of the pressure force values; and
calibrating the wafer centering mechanism of the clamshell based on the difference of the pressure force values.

16. The method of claim 15, further comprising replacing the pressure inspection element with a wafer after calibrating the wafer centering mechanism of the clamshell.

17. The method of claim 15, further comprising clamping the pressure inspection element using the cup and a cone of the clamshell prior to detecting pressure force values of the pressure sensors.

18. The method of claim 17, further comprising reducing a pressing force of the cone when the pressure force values are higher than a predetermined value.

19. The method of claim 17, further comprising increasing a pressing force of the cone when the pressure force values are lower than a predetermined value.

20. The method of claim 15, wherein the substrate of the pressure inspection element is transparent.

* * * * *